US006924593B2

(12) United States Patent
Seki et al.

(10) Patent No.: US 6,924,593 B2
(45) Date of Patent: Aug. 2, 2005

(54) MANUFACTURING METHOD FOR ORGANIC ELECTROLUMINESCENT DEVICE INCLUDING AN EFFECTIVELY OPTICAL AREA AND AN ORGANIC ELECTROLUMINESCENT LAYER, ORGANIC ELECTROLUMINESCENT DEVICE, AND ELECTRONIC DEVICES THEREWITH

(75) Inventors: Shunichi Seki, Suwa (JP); Katsuyuki Morii, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/786,060

(22) Filed: Feb. 26, 2004

(65) Prior Publication Data

US 2004/0166761 A1 Aug. 26, 2004

Related U.S. Application Data

(62) Division of application No. 09/991,984, filed on Nov. 26, 2001, now Pat. No. 6,784,459.

(30) Foreign Application Priority Data

Nov. 27, 2000 (JP) ........................................ 2000-359885
Nov. 21, 2001 (JP) ........................................ 2001-356190

(51) Int. Cl.$^7$ .............................. H01J 1/62; H01J 63/04
(52) U.S. Cl. ........................ 313/504; 313/506; 445/24; 445/50
(58) Field of Search ............................. 445/24, 25, 50, 445/51; 313/502, 503, 504, 505, 506

(56) References Cited

U.S. PATENT DOCUMENTS

| 5,903,246 | A | 5/1999 | Dingwall | ...................... 345/82 |
| 6,087,196 | A | 7/2000 | Sturm et al. | .................. 438/29 |
| 6,163,352 | A | 12/2000 | Ichikawa et al. | ........... 349/106 |
| 6,489,952 | B1 | 12/2002 | Tanaka et al. | ............... 345/205 |
| 6,580,212 | B2 | 6/2003 | Friend | ......................... 313/504 |
| 2001/0009689 | A1 | 7/2001 | Himeshima et al. | .......... 427/64 |
| 2002/0175620 | A1 | 11/2002 | Yokoyama et al. | |

FOREIGN PATENT DOCUMENTS

| EP | 1083775 A1 | 3/2001 |
| JP | 07-142169 A | 6/1995 |
| JP | A-7-235378 | 9/1995 |
| JP | A-10-12377 | 1/1998 |
| JP | 10-050481 A | 2/1998 |
| JP | A-10-153967 | 6/1998 |

(Continued)

OTHER PUBLICATIONS

Tang, C.W. et al., "Organic electroluminescent diodes", *Appl. Phys. Lett.*, vol. 51, No. 12, Sep. 21, 1987, pp. 913–915.

Sasaki, Keiji et al., "Three-dimensional potential analysis of radiation pressure exerted on asingle microparticle", *Appl. Phys. Lett.*, vol. 71, No. 1, Jul. 7, 1997, pp. 37–39.

European Search Report, dated May 28, 2003.

*Primary Examiner*—Joseph Williams
*Assistant Examiner*—Kevin Quarterman
(74) *Attorney, Agent, or Firm*—Oliff & Berridge, PLC

(57) ABSTRACT

A method for manufacturing an organic EL device in accordance with the invention includes: coating a composition including an organic EL material on a plurality of electrodes to form an organic EL layer on each electrode; defining an effectively optical area in which the plurality of electrodes are formed; and defining a coating area which is broader than the effectively optical area, on which the composition including an organic EL material is to be coated. According to this method, a uniform display device without uneven luminance and uneven chrominance within a pixel or among a plurality of pixels in the effectively optical area can be obtained.

11 Claims, 15 Drawing Sheets

FOREIGN PATENT DOCUMENTS

| | | |
|---|---|---|
| JP | A-11-40358 | 2/1999 |
| JP | A-11-54270 | 2/1999 |
| JP | 11-121168 A | 4/1999 |
| JP | A-11-339957 | 12/1999 |
| JP | 2000-012238 A | 1/2000 |
| JP | 2000-091083 A | 3/2000 |
| JP | 2000-148090 A | 5/2000 |
| JP | 2000-163014 A | 6/2000 |
| JP | 2001-313182 A | 11/2001 |
| JP | 2002-022924 A | 1/2002 |
| WO | WO0059267 | 10/2000 |
| WO | WO 01/78461 A | 10/2001 |

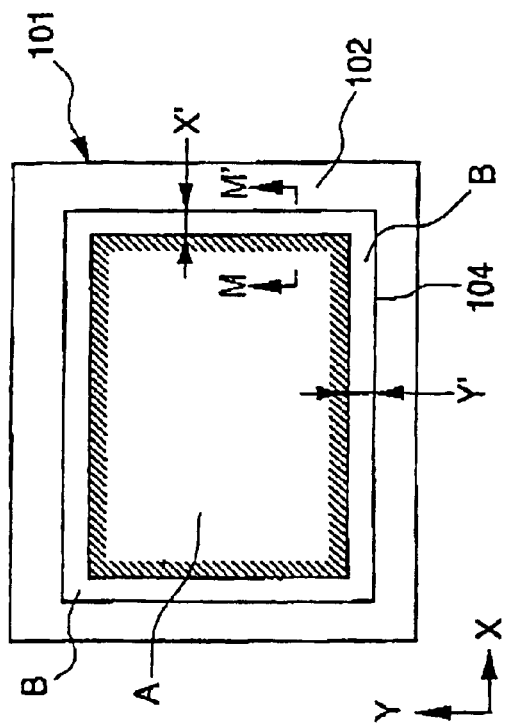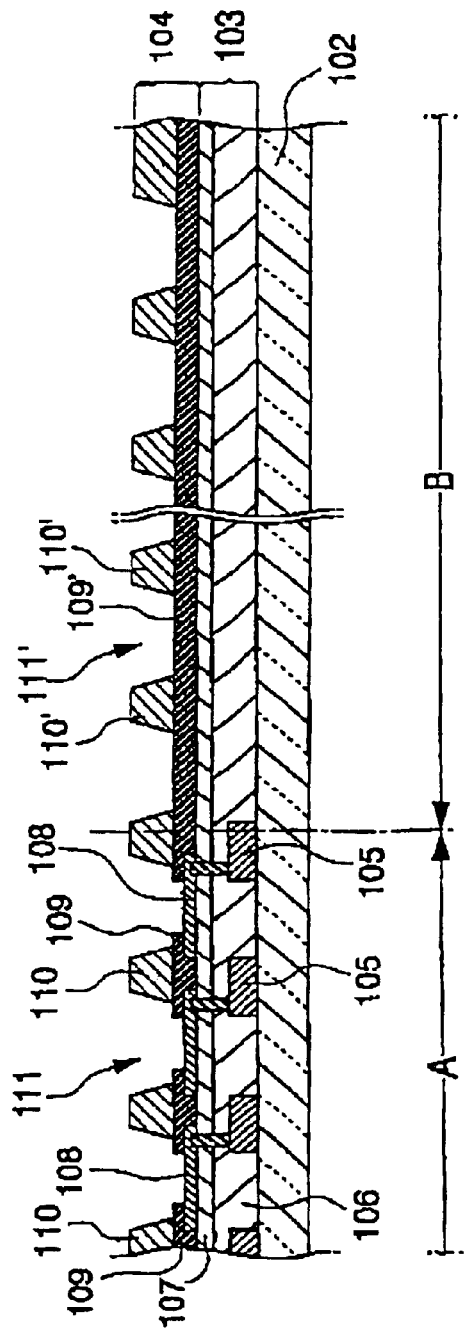

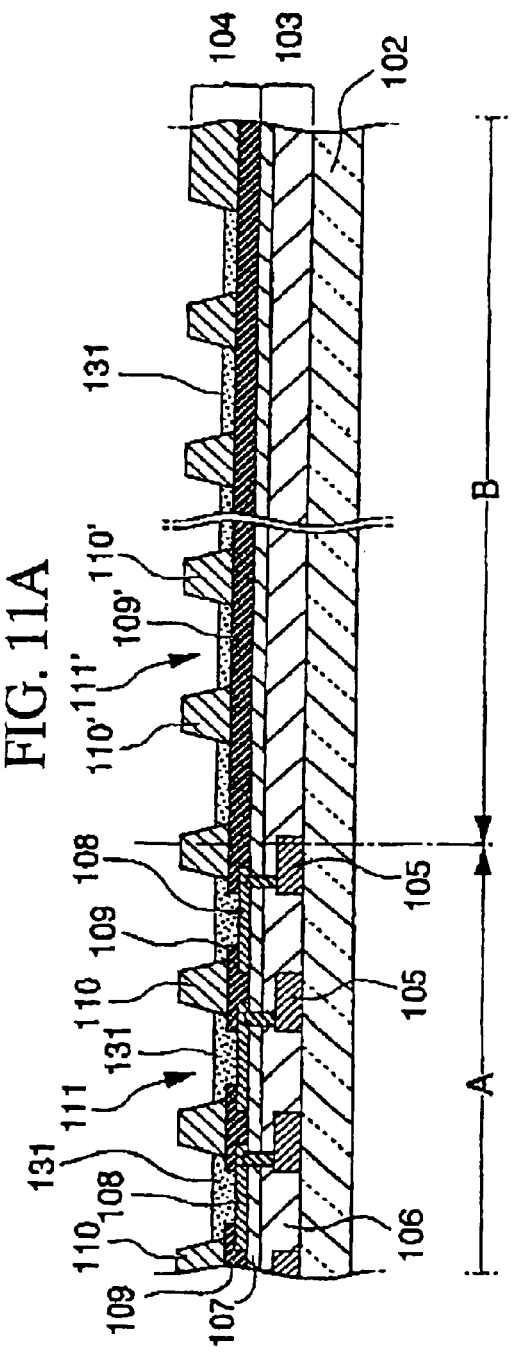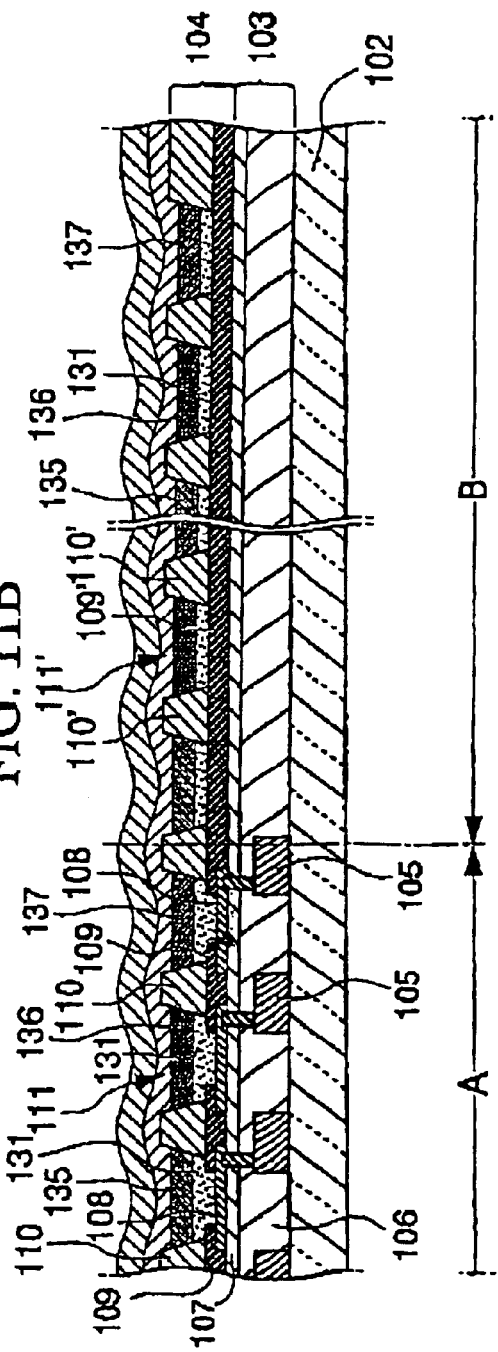

MANUFACTURING METHOD FOR ORGANIC ELECTROLUMINESCENT DEVICE INCLUDING AN EFFECTIVELY OPTICAL AREA AND AN ORGANIC ELECTROLUMINESCENT LAYER, ORGANIC ELECTROLUMINESCENT DEVICE, AND ELECTRONIC DEVICES THEREWITH

This is a Division of application Ser. No. 09/991,984 filed Nov. 26, 2001 and issued as U.S. Pat. No. 6,784,459 B2 on Aug. 31, 2004. The entire disclosure of the prior application is hereby incorporated by reference herein in its entirety.

BACKGROUND OF THE INVENTION

1. Field of the Invention

The present invention relates to an organic electroluminescent (hereinafter abbreviated as "EL") device and to a fabrication method therefor.

2. Description of the Related Art

In recent years, development has accelerated with regard to luminous elements that use organic substances as a self-luminous display device. This type of self-luminous display device may supplant conventional liquid crystal display devices. EL elements that use an organic substance as a luminous material can mainly be manufactured by forming a membrane using vapor deposition of an organic EL material (a luminous material) with low molecular weight, as disclosed beginning on page 913 of Appl. Phys. Lett. 51 (12), Sep. 21, 1987, and by coating an organic EL material with high molecular weight, as disclosed beginning on page 37 of Appl. Phys. Lett. 71 (1), Jul. 7, 1997.

For colorization in the case of a low molecular weight material, respective membranes are formed with various luminous materials which are vapor-deposited on respective pixels through covering masks. On the other hand, in the case of a high molecular weight material, it has been notable to realize colorization by a fine patterning using an ink-jet method. Fabrication methods of EL elements using an ink-jet method are disclosed in JP-H7-235378A1, JP-H10-12377A1, JP-H10-153967A1, JP-H11-40358A1, JP-H11-54270A1, JP-H11-339957A1, and U.S. Pat. No. 6,087,196B1.

SUMMARY OF THE INVENTION

A super fine patterning of an EL material can be realized by an ink-jet method because it is possible to eject droplets having a diameter of a few micrometers in a high resolution manner and to form a coating therewith. On the other hand, the minute droplets coated on a substrate tend to dry in an extremely short period, and they dry even faster at edge portions (e.g., upper edge, lower edge, right edge, and left edge) of the coated area on the substrate where the partial pressure of the vapor from the minute droplets coated on a pixel area is relatively low. In addition, in the case in which the EL elements are to be actively driven by TFT (thin-film transistor) elements in use, pixels may not be allowed to be evenly disposed in both X and Y directions due to the TFT elements and the shape and disposition of electric wires, and the partial pressure of the vapor may vary locally around the droplet coated on each of the pixels. The time difference in the drying period for the liquid organic material coated on the pixels thus produced may cause uneven thickness of the organic membrane within a pixel or among a plurality of pixels. The uneven thickness of the membrane, in turn, may cause uneven displaying performance, such as uneven luminance, uneven chrominance, etc.

Based on the above description, an object of the present invention is to provide an enhanced fabrication method for an organic EL device that includes ejecting and coating an organic EL material on electrodes to form an organic EL layer, with which uniform physical conditions and drying period for the liquid EL material coated on a pixel area can be realized, and a uniform organic EL device without uneven luminance and uneven chrominance within a pixel or among a plurality of pixels in an effectively optical area can be obtained. It is also an object of the invention to provide such an organic EL device manufactured in accordance with the above method.

The present invention provides a method for manufacturing an organic EL device by coating a composition including an organic EL material above a plurality of electrodes to form an organic EL layer above each of the electrodes. The method includes: defining an effectively optical area in which the plurality of electrodes are formed; and defining a coating area being broader than the effectively optical area, in which the composition including an organic EL material is to be coated.

According to the above fabrication method, uniform physical conditions near the liquid EL material coated on the effectively optical area and uniform drying period for the EL material can be realized in the effectively optical area, and consequently a uniform thickness of the layer within a pixel or among a plurality of pixels can be obtained. An organic EL layer herein referred to includes a variety of layers contributing to a luminous effect, such as a hole-injection layer, a luminous layer, and an electron-injection layer. An effectively optical area herein refers to an area for the display pixels when the organic EL device is a display device, and refers to an area contributing to lighting when the organic EL device is a lighting equipment.

In a method for manufacturing an organic EL device according to the present invention, the coating area preferably includes the perimeter of the effectively optical area.

According to this method, the drying period for droplets on the pixels located near edges of the effectively optical area being much shorter than that for droplets on the pixels located inside the effectively optical area is avoided. Thus, a uniform thickness of the layer among a plurality of effectively optical pixels can be obtained.

In another method for manufacturing an organic EL device according to the present invention, the coating area located along the perimeter of the effectively optical area is preferably a dummy area in which the organic EL material solution is also coated to form an organic EL membrane layer.

Preferably, the method further includes: forming a layer that is made of the same material as that of the electrodes in the dummy area; and coating the composition including an organic EL material on the layer.

According to the above method, uniform physical conditions near the liquid EL material coated on the pixels can be realized even for the pixels located near the edges of the effectively optical area, and the drying period for droplets on the pixels located near the edges of the effectively optical area being much shorter than that for droplets on the pixels located inside the effectively optical area is avoided. Thus, a uniform thickness of the EL membrane layer among a plurality of pixels can be obtained.

Another method for manufacturing an organic EL device according to the present invention preferably includes: providing a group of effectively optical areas formed of a plurality of the effectively optical areas on a substrate; and defining dummy areas around the effectively optical areas, respectively, and another dummy area encompassing the group of effectively optical areas.

A dummy area herein refers to an area relating to neither display nor lighting. Therefore, the organic EL layer formed in a dummy area does not have to be illuminable, but may be slightly illuminable as long as this does not interfere with either display or lighting.

According to the above method, uniform physical conditions near the liquid EL material coated on the pixels located near the edges of the effectively optical area can be realized like for other pixels, and the drying period for droplets on the pixels located near the edges of the effectively optical area being much shorter than that for droplets on the pixels located inside the effectively optical area is avoided. Thus, a uniform thickness of the EL membrane layer among a plurality of pixels can be obtained, even when a plurality of the effectively optical areas are formed on a substrate, each of which is separated from others, in the final manufacturing process, to fabricate a plurality of EL devices. In this way, a plurality of EL devices without uneven luminance and uneven chrominance within a pixel or among a plurality of pixels can be manufactured from a substrate at one time.

In another method for manufacturing an organic EL device according to the present invention, a process of coating of the composition including an organic EL material is preferably started at the dummy area prior to coating on the effectively optical area and ends at the dummy area after coating on the effectively optical area.

According to this method, since the process of coating of the organic EL material solution is started at the dummy area and ends at the dummy area, the coating for effectively optical areas in between can be performed in a stable condition.

In another method for manufacturing an organic EL device according to the present invention, individual areas to be coated in the entirety of the coating area are preferably disposed with a constant pitch to each other.

According to this method, uniform physical conditions near the liquid EL material coated on the effectively optical area and uniform drying period for the EL material can be realized in the effectively optical area. Consequently, a uniform thickness of the EL membrane layer within a pixel or among a plurality of pixels can be obtained.

In another method for manufacturing an organic EL device according to the present invention, any one of the electrodes is disposed relative to adjacent ones of the electrodes at a constant pitch. According to this method, uniform physical conditions near the liquid EL material coated on the effectively optical area and uniform drying period for the EL material can be realized in the effectively optical area. Consequently, a uniform thickness of the EL membrane layer within a pixel or among a plurality of pixels can be obtained.

The present invention provides a method for manufacturing an organic EL device which includes an effectively optical area having a plurality of electrodes and an organic EL layer formed above each of the electrodes. The method includes: forming the organic EL layer both on areas to be the effectively optical area and on other areas not to be the effectively optical area.

The present invention provides another method for manufacturing an organic EL device which includes an effectively optical area having a plurality of electrodes and an organic EL layer formed above each of the electrodes. The method includes: further forming the organic EL layer in areas not having the electrodes and which are supposed to be the effectively optical area.

The present invention also provides an organic EL device that is manufactured by one of the above methods. With such an organic EL device, uniform display performance without uneven luminance and uneven chrominance within a pixel or among a plurality of pixels is achieved.

An organic EL device according to the present invention preferably includes: a plurality of electrodes and an organic EL layer formed above each of the electrodes; an effectively optical area in which the electrodes are formed; and a dummy area disposed around the effectively optical area, in which the electrodes are also formed.

Preferably, an organic EL device according to the present invention further includes a bank layer disposed between the electrodes. The organic EL layer in the dummy area is disposed on a layer made of the same material as that of the bank layer.

In an organic EL device according to the present invention, the bank layer preferably includes an organic bank layer and an inorganic bank layer, and the organic EL layer in the dummy area is disposed on a layer made of the same material as that of the inorganic bank layer.

In an organic EL device, the bank layer is preferably disposed laterally between portions of the organic EL layer in the dummy area.

In an organic EL device according the present invention, the organic EL layer in the dummy area is preferably disposed on a layer made of the same material as that of the organic bank layer.

In an organic EL device of the present invention, the organic EL layer in the dummy area is preferably disposed on a layer made of the same material as that of the electrodes.

In an organic EL device of the present invention, the bank layer is preferably formed laterally between portions of the organic EL layer in the dummy area.

In an organic EL device of the present invention, adjacent potions of the organic EL layer are preferably disposed at a constant pitch in both the effectively optical area and the dummy area.

In an organic EL device according to the present invention, both the effectively optical area and the dummy area are preferably provided on a substrate, and portions in the effectively optical area on the substrate have substantially the same cross-sectional structure as that of portions in the dummy area on the substrate.

An organic EL device according to the present invention includes an effectively optical area having a plurality of electrodes and an organic EL layer formed on each of the electrodes, and the organic EL layer is formed both on areas supposed to be the effectively optical area and on other areas not supposed to be the effectively optical area.

An organic EL device according to the present invention includes an effectively optical area having a plurality of electrodes and an organic EL layer formed above each of the electrodes, and the organic EL layer is also formed in areas not having the electrodes and which are supposed to be the effectively optical area.

The present invention further provides an electronic device including such an organic EL device as described above. With such an electronic device, a uniform displaying performance without uneven luminance and uneven chrominance within a pixel or among a plurality of pixels is achieved.

BRIEF DESCRIPTION OF THE DRAWINGS

FIGS. 10A and 10B are schematics showing the eighth embodiment of the present invention for manufacturing an organic EL device; FIG. 10A is a plan view of a substrate before a hole-injection layer is formed, and FIG. 10B is a partial cross-sectional view taken along plane M–M' in FIG. 10A;

FIGS. 11A and 11B are cross-sectional views illustrating the eighth embodiment of the present invention for manufacturing an organic EL device;

DETAILED DESCRIPTION OF THE PREFERRED EMBODIMENTS

The preferred embodiments of the present invention will now be explained with reference to the drawings, wherein organic EL devices are specifically formed as display devices.

In a fabrication method for an EL device using an ink-jet method, a hole-injection/transportation layer and a luminous material layer are formed by ejecting a composite ink, produced by dissolving or dispersing a hole-injection layer material and a luminous material of pixel-forming organic substances in a solvent, from an ink-jet head, to coat the composite ink in a pattern on transparent electrodes. In order to accurately dispose the ejected ink droplets on predetermined areas of pixels, a partitioning wall (hereinafter referred to as a "bank") is typically provided to partition the areas of pixels.

Figure 1:
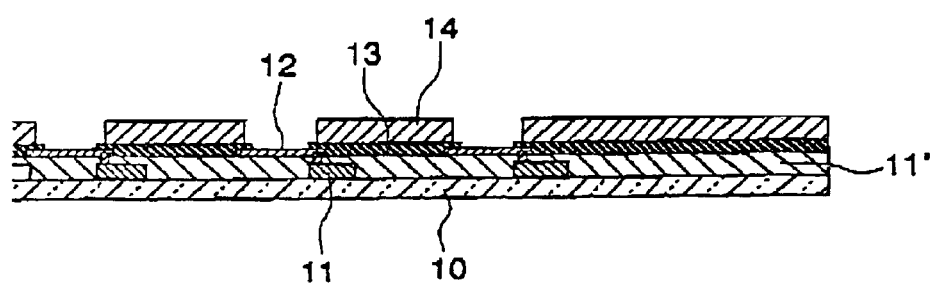
FIG. 1 is a cross-sectional view showing an example of a fabrication method for an organic EL device using an ink-jet method.

FIG. 1 is a cross-sectional view showing an example of a substrate structure that is included in a method for manufacturing an organic EL device using an ink-jet method. A circuit element portion 11' having thin-film transistors (TFTs) 11 is formed on a glass substrate 10, and transparent electrodes 12 made of ITO (Indium Tin Oxide) are formed in a pattern on the circuit element portion 11'. In addition, $SiO_2$ banks 13 and organic banks 14 including an ink-repelling organic substance or an organic substance made to be ink-repelling are laminated on the sections that separate the transparent electrodes 12 to each other. The shape of apertures defined by the banks may be, for example, circular, oval, or quadrangular; however, in the case of the quadrangular shape, the corners thereof preferably have a certain curvature since the composite ink inherently has a surface tension. The material of the organic banks 14 may be selected from any materials that provide excellent heat resistance, liquid-repellency, resistance ink solvents, and adhering capability to a base substrate. The material for the organic banks 14 is not necessarily an inherently liquid-repelling material, such as fluororesin. For example, it may also be a patterned organic resin, such as acrylic resin, polyimide resin, or the like, as is normally used, whose surface is made liquid-repelling by $CF_4$ plasma treatment or the like. Although the banks need not be formed by laminating inorganic substances and organic substances, $SiO_2$ banks 13 are preferably provided in order to enhance adherence to the transparent electrodes 12 when the transparent electrodes 12 are, for example, made of ITO. A height of approximately 1 to 2 micrometers for the organic banks 14 is sufficient.

Figure 2A:
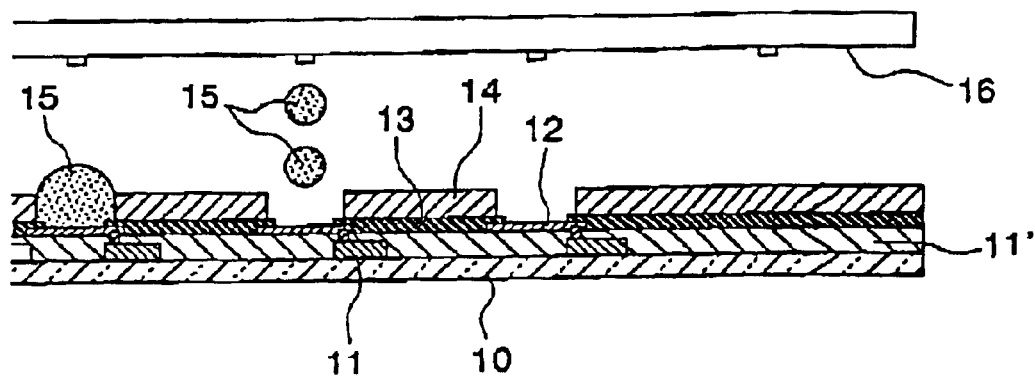
FIGS. 2A to 2C are cross-sectional views showing an example of a fabrication method for an organic EL device using an ink-jet method relating to the present invention.
Figure 2B:
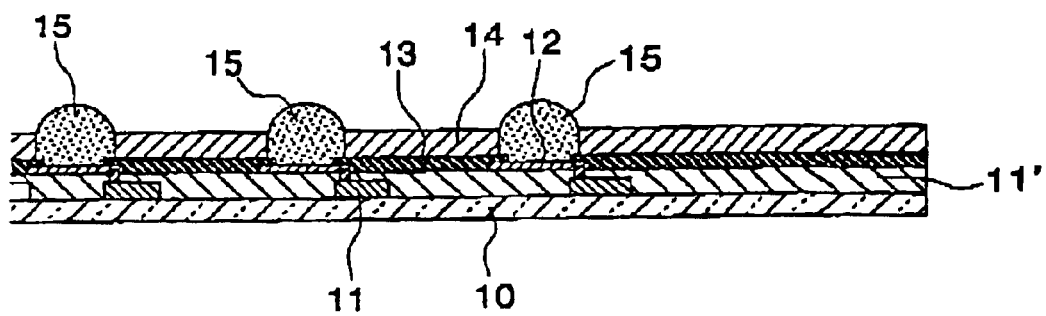
Figure 2C:
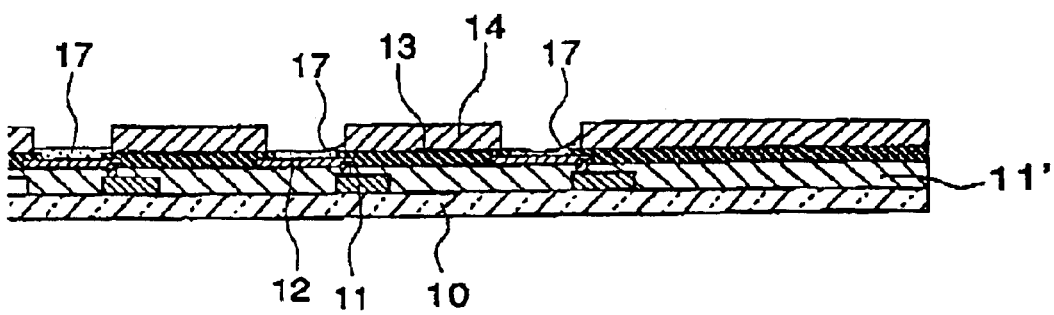

An example of a fabrication method for an EL device that uses an ink-jet method will be explained below with reference to FIGS. 2A to 2C showing each step of the fabrication process.

As shown in FIG. 2A, a solution including an organic EL material (composite ink) is coated in a pattern on a substrate for pixels using an ink-jet method to form an organic EL membrane. Composite ink 15 of an organic EL material is ejected from an ink-jet head 16 and is deposited in a predetermined pattern as shown in FIG. 2B. After coating, the solvent in the composite ink is removed by a vacuum treatment and/or heat treatment or flow of nitrogen gas or the like to form organic EL membrane layers 17, as shown in FIG. 2C. The organic EL membrane layers 17 are laminated membranes including, for example, a hole-injection layer and a luminous layer.

In this process, the solvent of the composite ink dries more quickly on the display pixels located near the edges of the effectively optical area, i.e., an area in which pixels relating to display are formed, than on the pixels inside the area since ink droplets are not coated around the pixels located near the edges of the area and the partial pressure of the vapor from the ink solvent is lower above the display pixels located near the edges of the area than on the pixels inside the area, which may cause thickness variations in the membranes among the display pixels, as shown FIG. 2C.

In order to uniformly dry droplets coated on each of the pixels, the physical conditions of respective droplets coated on the effectively optical area are preferably set to be uniform by ejecting and depositing the composite ink around the effectively optical area as well. More preferably, the organic material is coated by an ink-jet method over an area that is broader than the effectively optical area, whereby a dummy area, i.e., an area in which dummy pixels not relating to display are formed, including the same bank structure as display pixels, is defined around the effectively optical area so as to provide physical conditions which are as uniform as possible for each of the display pixels.

Individual areas to be coated in the effectively optical area are preferably disposed at a constant pitch to each other in order to provide as uniform a drying period for the composite ink as possible among the pixels in the effectively optical area. For this purpose, the pixels are preferably disposed at a constant pitch to each other as well. In the case in which the pitch of the pixels in the X direction is different from that in the Y direction due to disposition of TFTs and bonding wires, ink droplets are preferably ejected in the area between the pixels disposed at a wider pitch so that individual areas to be coated in the entirety of the area for the display pixels are disposed at a constant pitch from each other. More preferably, dummy pixels comprising the same bank structure as the display pixels are formed in the area between the pixels disposed at a wider pitch. The shape of the pixels is not limited to a rotationally symmetric shape, such as a circle or a square. For example, it may also be a rectangle, an oval, or an ellipse. When the pixels having the shape of a rectangle or an oval are disposed at different pitches in the X direction and in the Y direction, a similar effect can be obtained by providing further areas to be coated in the area between the pixels disposed at a wider pitch so that the areas to be coated are evenly disposed, although each of the additional areas to be coated is differently shaped from the display pixels.

The present invention can not only be applied to a display of an organic EL device, but also to luminous devices and lighting equipment using organic-EL elements as a light source, for example.

Although the present invention will be more specifically explained below with reference to several embodiments, the invention is not limited to these specific embodiments.

First Embodiment

Figure 3A:
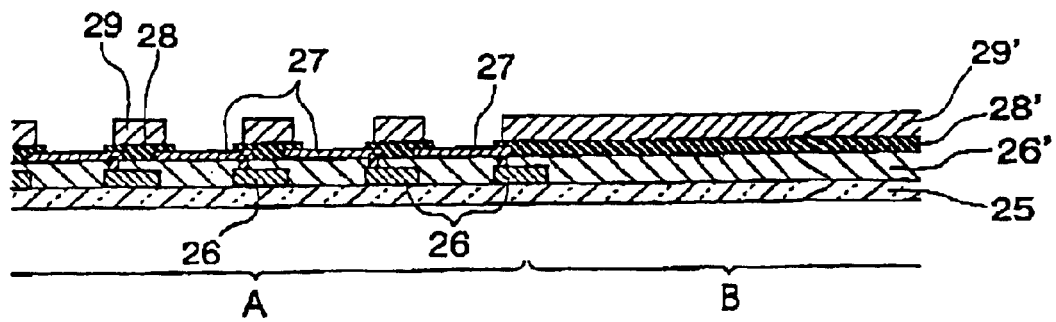
FIGS. 3A to 3D are cross-sectional views illustrating the first embodiment of the present invention for manufacturing an organic EL device.

The substrate used in the first embodiment is a 2-inch TFT substrate in which circular pixels having diameters of 30 $\mu$m are disposed at a pitch of 70.5 $\mu$m in both X and Y directions. This TFT substrate includes a glass substrate 25 and a circuit element portion 26' having TFTs 26 formed on the glass substrate. FIG. 3A is a partial cross-sectional view (along the X direction) of the right edge portion of the TFT substrate. Transparent electrodes 27 made of ITO are formed on the circuit element portion 26' and banks including two layers including SiO$_2$ banks 28 and polyimide banks 29 are constructed on the circuit element portion 26' so as to divide the transparent electrodes 27. The SiO$_2$ banks 28 are manufactured in a pattern by photo-etching after forming a 150 nm thick TEOS (tetraethylorthosilicate) layer by CVD (Chemical Vapor Deposition). The polyimide banks 29, which are 2 $\mu$m thick, are formed on the SiO$_2$ banks 28 through the steps of coating a photosensitive polyimide on the SiO$_2$ banks 28, exposure, and development. The material used to form the banks may be a non-photosensitive substance.

In FIGS. 3A to 3D, the area in which the transparent electrodes 27 are formed is an effectively optical area A and the area in which the transparent electrodes 27 are not divided by the SiO$_2$ banks 28, and the polyimide banks 29 is a dummy area B.

The polyimide banks 29 are made ink-repelling by atmospheric plasma treatment before applying ink using an ink-jet method. The atmospheric plasma treatment that is performed under conditions comprising atmospheric pressure, a power of 300 W, and 1 mm gap between the electrodes and the substrate includes an oxygen plasma treatment that is performed under conditions comprising an oxygen gas flow rate of 100 ml/m, a helium gas flow rate of 10 l/m, and a table speed of 10 mm/s and a consequent CF$_4$ plasma treatment that is performed under conditions comprising a CF$_4$ gas flow rate of 100 ml/m, a helium gas flow rate of 10 l/m, and a reciprocating table speed of 3 mm/s.

Figure 3B:
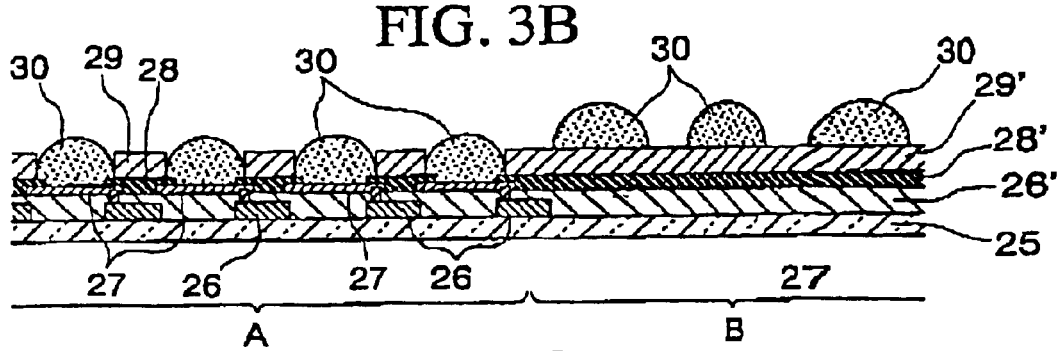

Composite ink 30, including Baytron™ supplied by Bayer AG as a hole-injection layer material which is dispersed by a polar solvent including isopropyl alcohol, N-methylpyrolidone, and 1,3-dimethyl-2-imidazolidinone, is ejected from an ink-jet head (e.g., model MJ-930C made by Seiko Epson Corporation) to coat at a pitch of 70.5 $\mu$m in both the X and Y directions. In this coating process, another 30 rows of ejection at the same pitch in both lateral and longitudinal directions around the display pixels is performed. FIG. 3B is a partial cross-sectional view of the right edge portion of the substrate after the composite ink 30 of the hole-injection layer material is coated in a pattern. While the composite ink 30 of the hole-injection layer material is coated on the transparent electrodes 27 in the effectively optical area A, the composite ink 30 of the hole-injection layer material is coated on the polyimide banks 29 in the dummy area B.

Figure 3C:
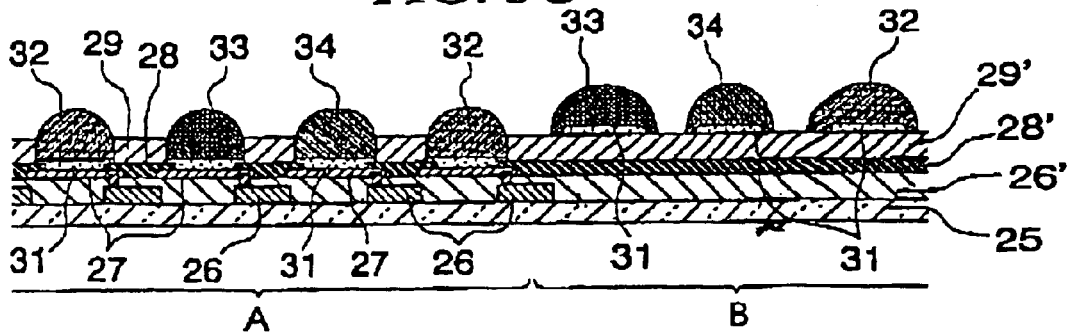

Consequently, the solvent is removed by a treatment at room temperature in a vacuum (1 Torr (133.3 Pa)) for 20 minutes, and then a hole-injection layer 31 is formed, as shown in FIG. 3C, by heat treatment at 200° C. (on a hot plate) in nitrogen gas for 20 minutes. The hole-injection layer 31 having a uniform thickness can thus be manufactured in the effectively optical area A.

In the next process, three kinds of composite inks, i.e., a composite ink 32 for a red luminous layer, a composite ink 33 for a green luminous layer, and a composite ink 34 for a blue luminous layer, are prepared using polyfluorene materials to form luminous layers emitting red, green, and blue light, respectively. Cyclohexylbenzene is used as the ink solvent. As shown in FIG. 3C, the composite inks 32, 33, and 34 are coated in a pattern by ejecting from the ink-jet head at a pitch of 211.5 $\mu$m in the X direction and at a pitch of 70.5 $\mu$m in the Y direction. In this coating process, another 21 rows of ejection at the same pitch in both lateral and longitudinal directions in the dummy area B is performed.

Then, luminous layers 35, 36, and 37 are formed by heat treatment at 80° C. on a hot plate in nitrogen gas for 5 minutes. The luminous layers 35, 36, and 37, having a uniform thickness, can thus be formed in the effectively optical area A.

Figure 3D:
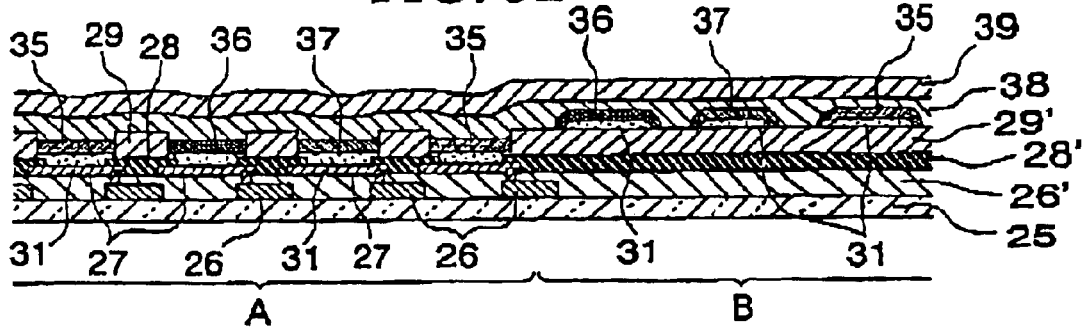

After forming the luminous layers, a LiF layer 2 nm thick, a Ca layer 20 nm thick, and an Al layer 200 nm thick are respectively laminated by a heated vapor deposition in a vacuum so as to form a cathode 38, and finally, a layer of epoxy resin 39 is formed to perform sealing, as shown in FIG. 3D.

An organic EL device without uneven luminance and uneven chrominance in the area for the display pixels can thus be manufactured.

Second Embodiment

Figure 4A:
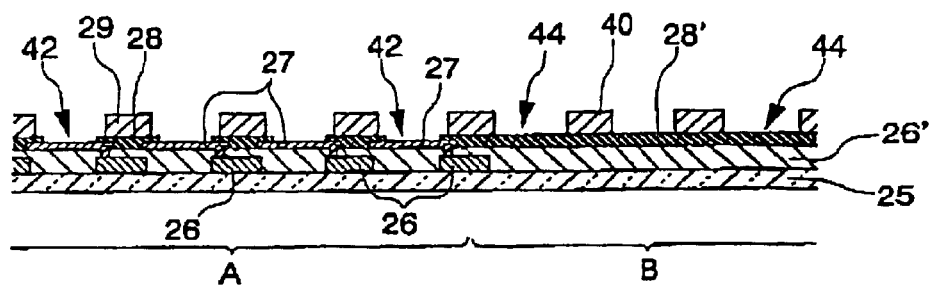
FIGS. 4A and 4B are cross-sectional views illustrating the second embodiment of the present invention for manufacturing an organic EL device.
Figure 4B:
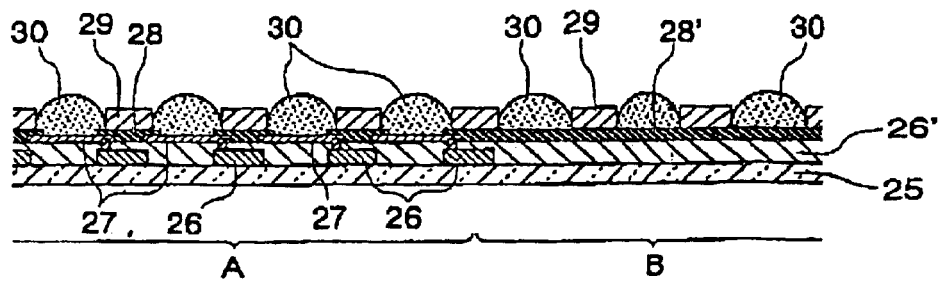

In the second embodiment shown in FIGS. 4A and 4B, a TFT substrate in which a dummy area B is disposed around an effectively optical area A is used, as in the first embodiment. This TFT substrate includes a glass substrate 25 and a circuit element portion 26' having TFTs 26 formed on the glass substrate. Transparent electrodes 27 made of ITO are formed on the circuit element portion 26' and banks including two layers including SiO$_2$ banks 28 and polyimide banks 29 are constructed on the circuit layer 26' so as to divide the transparent electrodes 27. Thus, display pixels 42 are formed in the effectively optical area A.

A SiO$_2$ membrane 28' extending from the SiO$_2$ banks is formed in the dummy area B. The dummy pixels 43 having the same shape as that of the display pixels 42 and disposed at the same pitch as that at which the display pixels 42 are disposed are defined by polyimide banks 40. FIG. 4A is a partial cross-sectional view of the right edge portion of the substrate.

The same composite ink 41 for the hole-injection layer as in the first embodiment is coated in a pattern on both the display pixels 42 and the dummy pixels 43 at a pitch of 70.5 μm, as shown in FIG. 4B. The hole-injection layers of the display pixels 42 have a uniform thickness upon completion through the steps of drying and heat treatment as in the first embodiment.

In the next process, composite inks for luminous layers including polyfluorene materials are coated in a pattern on the display pixels 42 and the dummy pixels 43 as in the first embodiment, the luminous layers have a uniform thickness within the display pixels 42 upon completion after drying. The organic EL device has neither uneven luminance nor uneven chrominance in the effectively optical area A including the display pixels 42 upon completion through the steps of cathode forming and sealing.

Third Embodiment

Figure 5A:
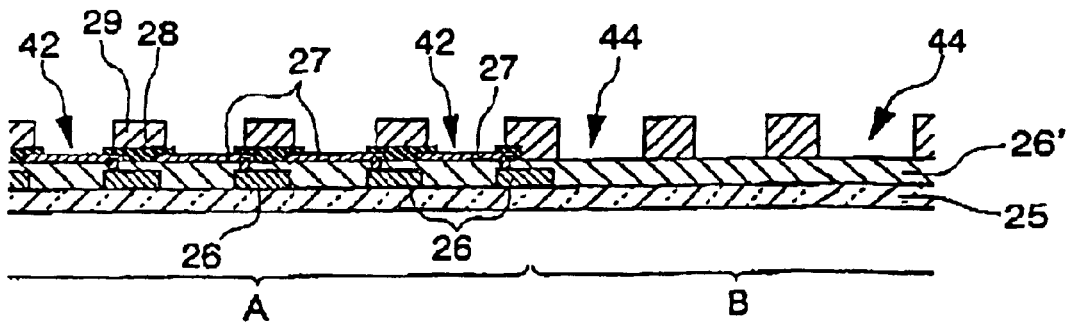
FIGS. 5A to 5D are cross-sectional views illustrating the third embodiment of the present invention for manufacturing an organic EL device.

In the third embodiment shown in FIGS. 5A to 5D, a TFT substrate in which a dummy area B is disposed around an effectively optical area A, is used, as in the first embodiment. This TFT substrate includes a glass substrate 25 and a circuit element portion 26' having TFTs 26 formed on the glass substrate, as shown in FIG. 5A. Transparent electrodes 27 made of ITO are formed on the circuit element portion 26' and banks including two layers including SiO$_2$ banks 28 and polyimide banks 29 are constructed on the circuit element portion 26' so as to divide the transparent electrodes 27. Thus, display pixels 42 are formed in the effectively optical area A.

On the circuit element portion 26' in the dummy area B, dummy pixels 44 having the same shape and disposed at the same pitch as the display pixels 42 are only defined by polyimide banks 29. FIG. 5A is a partial cross-sectional view of the right edge portion of the substrate.

The polyimide banks 29 are made to be ink-repelling by atmospheric pressure plasma treatment, as in the first embodiment.

Figure 5B:
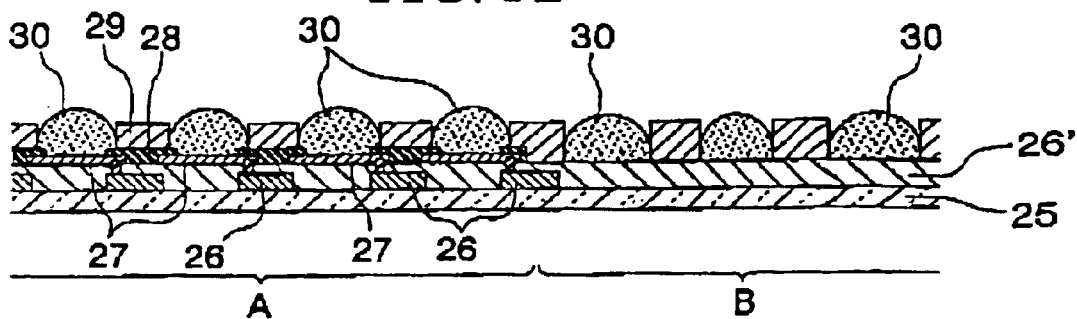

As shown in FIG. 5B, composite ink 30 including the hole-injection layer material is coated in a pattern on the display pixels 42 and the dummy pixels 43 at a pitch of 70.5 μm, as in the first embodiment. While the composite ink 30 of the hole-injection layer material is coated on the transparent electrodes 27 in the effectively optical area A, the composite ink 30 of the hole-injection layer material is coated on the circuit element portion 26' in the dummy area B.

Figure 5C:
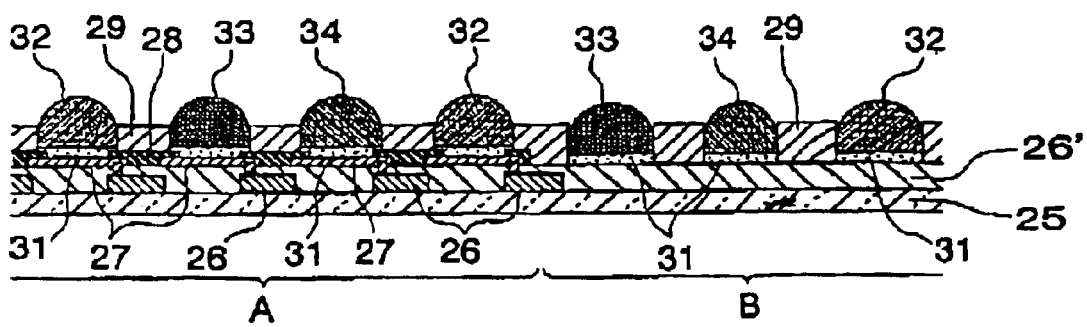

Consequently, the solvent is removed by a treatment at room temperature in a vacuum (1 Torr (133.3 Pa)) for 20 minutes, and then a hole-injection layer 31 is formed, as shown in FIG. 5C, by heat treatment at 200° C. (on a hot plate) in nitrogen gas for 10 minutes. The hole-injection layer 31 having a uniform thickness can thus be manufactured in the effectively optical area A.

In the next process, three kinds of composite ink, i.e., a composite ink 32 for a red luminous layer, a composite ink 33 for a green luminous layer, and a composite ink 34 for a blue luminous layer, are prepared, and the composite inks 32, 33, and 34 are coated in a pattern by ejecting from an ink-jet head at a pitch of 211.5 μm in the X direction and at a pitch of 70.5 μm in the Y direction, respectively, as shown in FIG. 5C. In this coating process, another 21 rows of ejection at the same pitch in both lateral and longitudinal directions in the dummy area B is preferably performed.

Then, luminous layers 35, 36, and 37 are formed by heat treatment at 80° C. on a hot plate in nitrogen gas for 5 minutes. The luminous layers 35, 36, and 37 having a uniform thickness can thus be formed in the effectively optical area A.

Figure 5D:
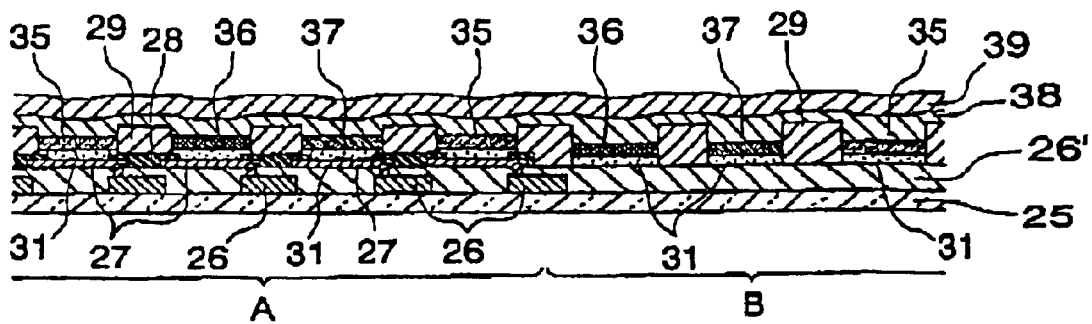

After forming the luminous layers, a LiF layer 2 nm thick, a Ca layer 20 nm thick, and an Al layer 200 nm thick are respectively laminated by a heated vapor deposition in a vacuum so as to form a cathode 38, and finally, a layer of epoxy resin 39 is formed to provide sealing, as shown in FIG. 5D.

An organic EL device without uneven luminance and uneven chrominance in the effectively optical area A can thus be manufactured.

Fourth Embodiment

Figure 6A:
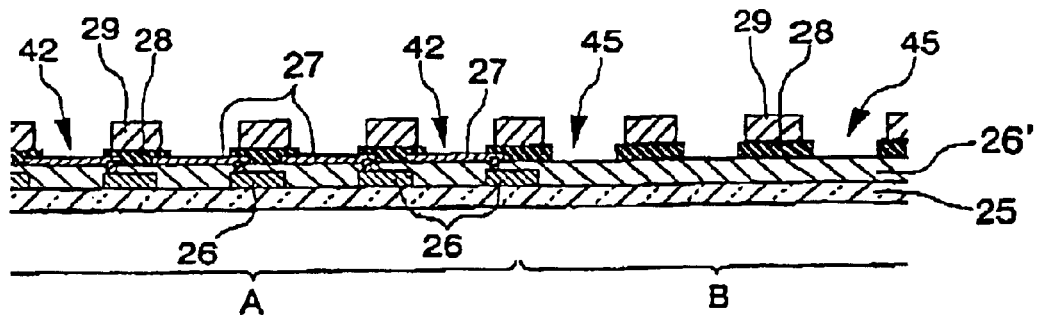
FIGS. 6A to 6D are cross-sectional views illustrating the fourth embodiment of the present invention for manufacturing an organic EL device.

In the fourth embodiment shown in FIGS. 6A to 6D, a TFT substrate in which a dummy area B is disposed around an effectively optical area A is used, as in the first embodiment. This TFT substrate includes a glass substrate 25 and a circuit element portion 26' having TFTs 26 formed on the glass substrate, as shown in FIG. 6A. Transparent electrodes 27 made of ITO are formed on the circuit element portion 26' and banks including two layers including SiO$_2$ banks 28 and polyimide banks 29 are constructed on the circuit element portion 26' so as to divide the transparent electrodes 27. Thus, display pixels 42 are formed in the effectively optical area A.

On the circuit element portion 26' in the dummy area B, dummy pixels 45 having the same shape and disposed at the same pitch as the display pixels 42 are formed by laminating the SiO$_2$ banks 28 and the polyimide banks 29. FIG. 6A is a partial cross-sectional view of the right edge portion of the substrate.

Figure 6B:
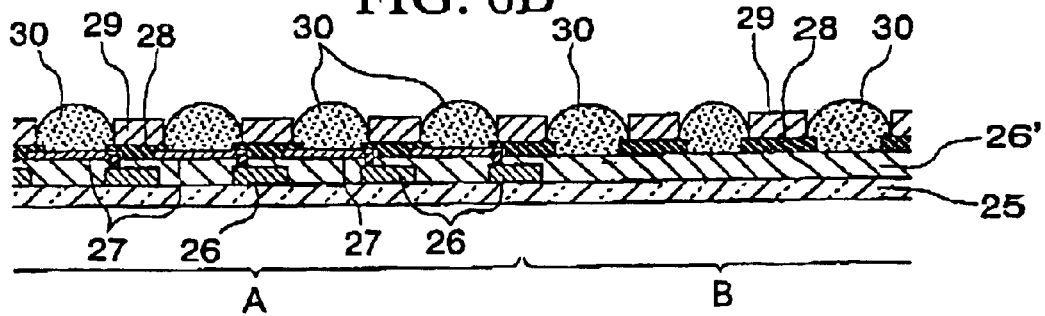

Then, as in the first embodiment, the polyimide banks 29 are made to be ink-repelling by atmospheric pressure plasma treatment and composite ink 30 including the hole-injection layer material is coated in a pattern on the display pixels 42 and the dummy pixels 45, as shown in FIG. 6B. While the composite ink 30 of the hole-injection layer material is coated on the transparent electrodes 27 in the effectively optical area A, the composite ink 30 of the hole-injection layer material is coated on the circuit element portion 26' in the dummy area B.

Figure 6C:
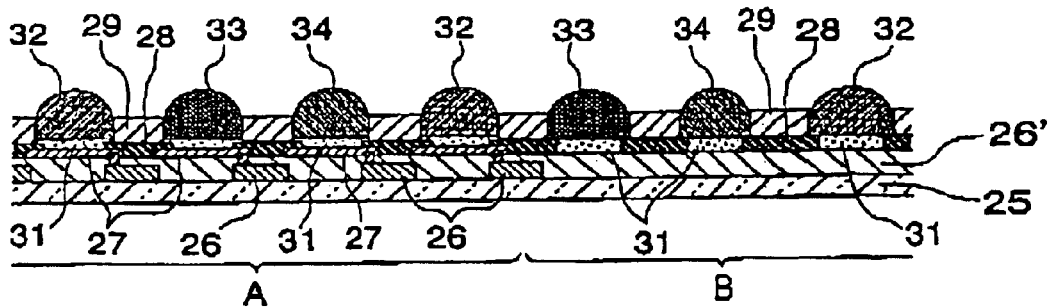

Consequently, the solvent is removed under the same condition as in the first embodiment, and then a hole-injection layer 31 is formed, as shown in FIG. 6C, by heat treatment under the same conditions as in the first embodiment. The hole-injection layer 31 having a uniform thickness can thus be manufactured in the effectively optical area A.

In the next process, a composite ink 32 for a red luminous layer, a composite ink 33 for a green luminous layer, and a composite ink 34 for a blue luminous layer are prepared and each of the composite inks 32, 33, and 34 is coated in a pattern by ejecting from an ink-jet, as shown in FIG. 6C. In this coating process, another 21 rows of ejection at the same pitch in both lateral and longitudinal directions in the dummy area B is performed.

Then, luminous layers 35, 36, and 37 are formed by heat treatment at 80° C. on a hot plate in nitrogen gas for 5 minutes. The luminous layers 35, 36, and 37 having a uniform thickness can thus be formed in the effectively optical area A.

Figure 6D:
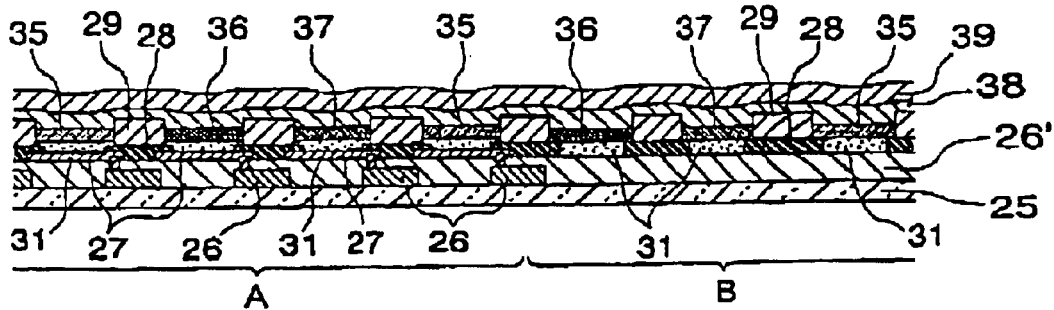

After forming the luminous layers, a LiF layer 2 nm thick, a Ca layer 20 nm thick, and an Al layer 200 nm thick are respectively laminated by heated vapor deposition in a vacuum so as to form a cathode 38, and finally, a layer of epoxy resin 39 is formed to provide sealing, as shown in FIG. 6D.

An organic EL device without uneven luminance and uneven chrominance in the effectively optical area A can thus be manufactured.

Fifth Embodiment

Figure 7A:
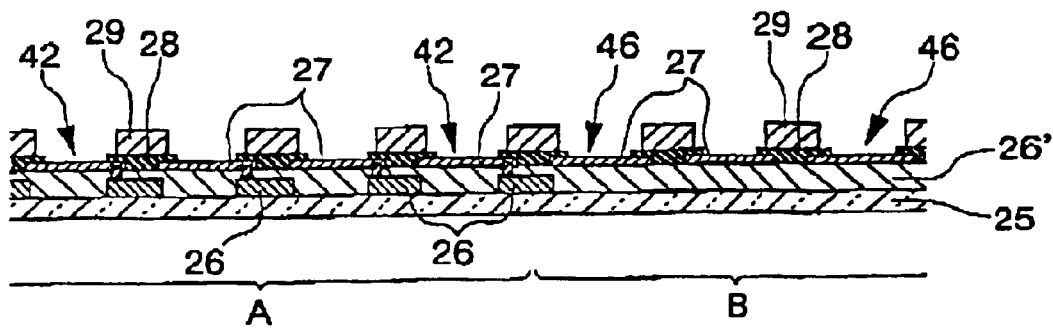
FIGS. 7A to 7D are cross-sectional views illustrating the fifth embodiment of the present invention for manufacturing an organic EL device.

In the fifth embodiment shown in FIGS. 7A to 7D, a TFT substrate in which a dummy area B is disposed around an effectively optical area A is used, as in the first embodiment. This TFT substrate includes a glass substrate 25 and a circuit element portion 26' having TFTs 26 formed on the glass substrate, as shown in FIG. 7A. Transparent electrodes 27 made of ITO are formed on the circuit element portion 26' and banks including two layers including $SiO_2$ banks 28 and polyimide banks 29 are constructed on the circuit element portion 26' so as to divide the transparent electrodes 27. Thus, display pixels 42 are formed in the effectively optical area A.

On the circuit element portion 26' in the dummy area B, dummy pixels 46 having the same shape and disposed at the same pitch as the display pixels 42 are formed by laminating the $SiO_2$ banks 28 and the polyimide banks 29. The TFTs 26 are not provided in the circuit element portion 26' in the dummy area B. FIG. 7A is partial cross-sectional view of the right edge portion of the substrate.

Figure 7B:
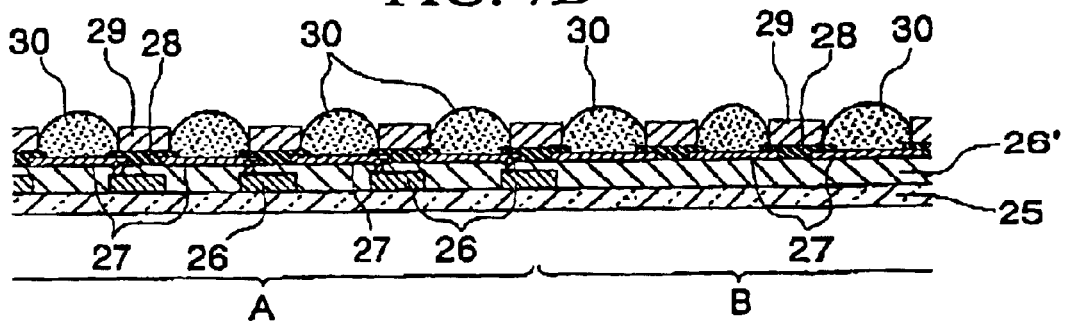

Then, as in the first embodiment, the polyimide banks 29 are made to be ink-repelling by atmospheric pressure plasma treatment and composite ink 30 including the hole-injection layer material is coated in a pattern on the display pixels 42 and the dummy pixels 46, as shown in FIG. 7B. While the composite ink 30 of the hole-injection layer material is coated on the transparent electrodes 27 in the effectively optical area A, the composite ink 30 of the hole-injection layer material is coated on the circuit element portion 26' in the dummy area B.

Figure 7C:
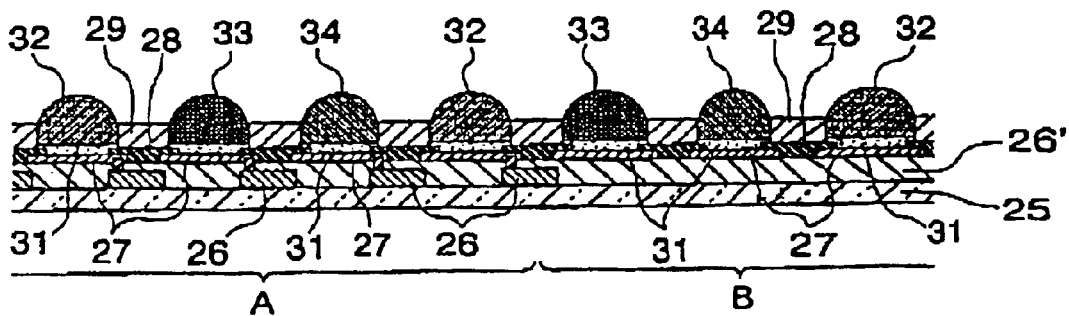

Consequently, the solvent is removed under the same conditions as in the first embodiment. Then, a hole-injection layer 31 is formed, as shown in FIG. 7C, by heat treatment under the same conditions as in the first embodiment. The hole-injection layer 31 having a uniform thickness can thus be manufactured in the effectively optical area A.

In the next process, a composite ink 32 for a red luminous layer, a composite ink 33 for a green luminous layer, and a composite ink 34 for a blue luminous layer are prepared and each of the composite inks 32, 33, and 34 is coated in a pattern by ejecting from an ink-jet, as shown in FIG. 7C. In this coating process, another 21 rows of ejection at the same pitch in both lateral and longitudinal directions in the dummy area B is preferably performed.

Then, luminous layers 35, 36, and 37 are formed by heat treatment at 80° C. on a hot plate in nitrogen gas for 5 minutes. The luminous layers 35, 36, and 37 having a uniform thickness can thus be formed in the effectively optical area A.

Figure 7D:
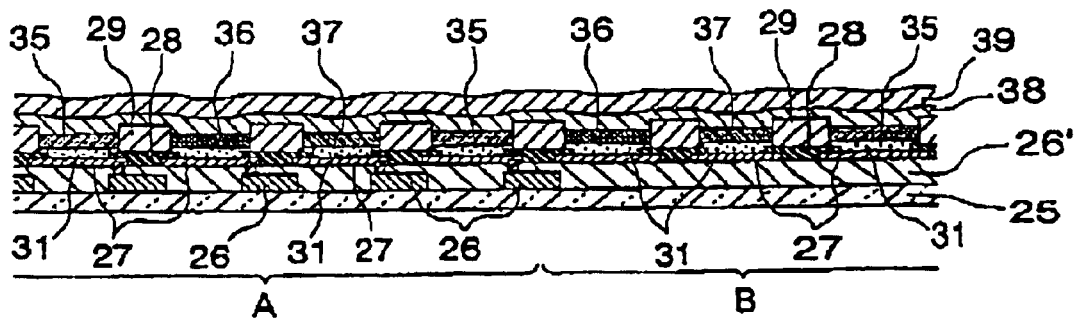

After forming the luminous layers, a LiF layer 2 nm thick, a Ca layer 20 nm thick, and an Al layer 200 nm thick are respectively laminated by a heated vapor deposition in a vacuum so as to form a cathode 38, and finally, a layer of epoxy resin 39 is formed to provide sealing, as shown in FIG. 7D.

An organic EL device without uneven luminance and uneven chrominance in the effectively optical area A can thus be manufactured.

The dummy pixels 46 include the transparent electrodes 27 and the $SiO_2$ banks 28 and the polyimide banks 29 which divide the transparent electrodes 27. Since the dummy pixels 46 are formed similarly to the display pixels 42, except that the TFTs are not included, the composite ink 30 of the hole-injection layer material coated on the dummy pixels 46 can be dried under the same conditions as for the display pixels 42. Thus, the hole-injection layer 31 having a uniform thickness can be manufactured in the effectively optical area A and an organic EL device without uneven luminance and uneven chrominance in the area for the display pixels can be obtained.

Sixth Embodiment

Figure 8A:
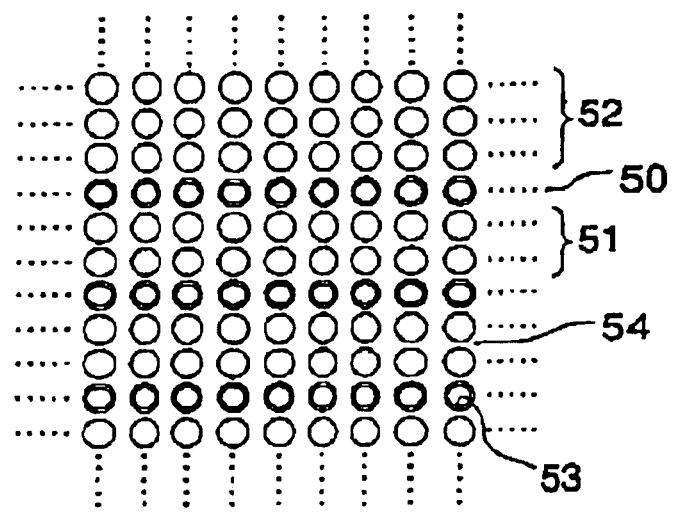
FIGS. 8A to 8C are schematics illustrating the sixth embodiment of the present invention for manufacturing an organic EL device.

FIG. 8A is a schematic of a part of the area for the display pixels and the area for the dummy pixels used in the sixth embodiment. FIG. 8A is a plan view of a substrate and TFT elements are not shown in this view. Circular pixels 50 having diameters of 60 $\mu$m are disposed at a pitch of 80 $\mu$m in a lateral (X) direction and at a pitch of 240 $\mu$m in a longitudinal (Y) direction. In a longitudinal direction, dummy bank pixels 51 are disposed between the display pixels at a pitch of 80 $\mu$m. Another 30 rows of dummy pixels 52 having the same shape as the display pixels are disposed all around the effectively optical area at a pitch of 80 $\mu$m. The display pixels in the sixth embodiment are defined by laminated banks including $SiO_2$ banks 53 and polyimide banks 54 as in the above embodiments and have similar sectional structure as in the first and the second embodiment except for the diameter of the pixels and the disposing pitch.

Figure 8B:
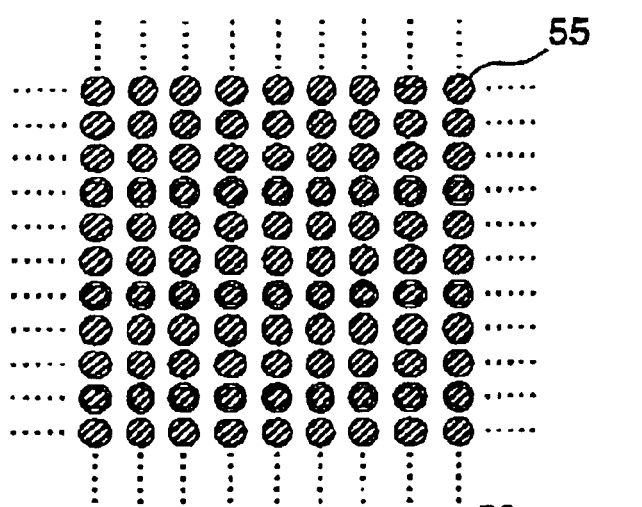
Figure 8C:
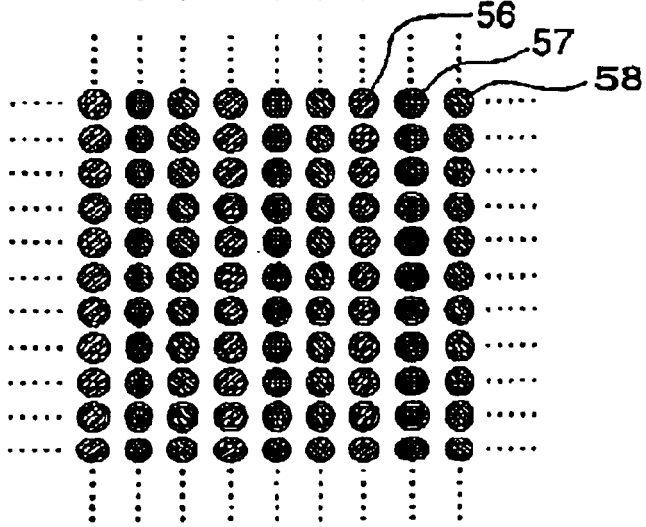

Composite ink 55 for a hole-injection layer as in the first embodiment is coated in a pattern on the display pixels 50 and the dummy pixels 51 and 52 at a pitch of 80 $\mu$m, as shown in FIG. 8B. After forming the hole-injection layer as in the first embodiment, a luminous layer is formed by depositing three kinds of composites 56, 57, and 58 for the luminous layer as in the first embodiment at a pitch of 80 $\mu$m in a longitudinal direction and a pitch of 240 $\mu$m in a lateral direction and by drying them. The composite inks for the luminous layer are deposited in a pattern, as shown in FIG. 8C. Upon completion of further steps of cathode forming and sealing, the organic EL device shows neither uneven luminance nor uneven chrominance in the effectively optical area.

Seventh Embodiment

Figure 9A:
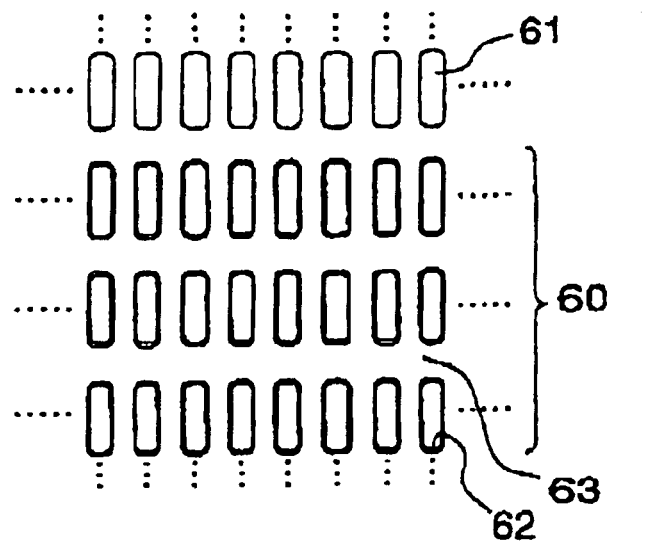
FIGS. 9A to 9C are schematics illustrating the seventh embodiment of the present invention for manufacturing an organic EL device.

FIG. 9A is a schematic of a part of the effectively optical area and the dummy area used in the seventh embodiment. FIG. 9A is a plan view of a substrate, and TFT elements are not shown in this view. Rectangular pixels 60 which are 50 $\mu$m wide and 200 $\mu$m long (and having rounded corners) are disposed at a pitch of 80 $\mu$m in a lateral (X) direction and at a pitch of 290 $\mu$m in a longitudinal (Y) direction. The gap between the pixels in a lateral direction is 30 $\mu$m and the gap between the pixels in a longitudinal direction is 90 $\mu$m. Another 30 rows of dummy pixels 61 having the same shape as the display pixels are disposed all around the areas for the display pixels 60 at a pitch of 80 $\mu$m and a pitch of 290 $\mu$m in respective directions. The display pixels 60 are defined by laminated banks including $SiO_2$ banks 62 and polyimide banks 63 as in the above embodiments and have similar sectional structure as in the first and the second embodiment, except for the size of the pixels and the disposing pitch.

Figure 9B:
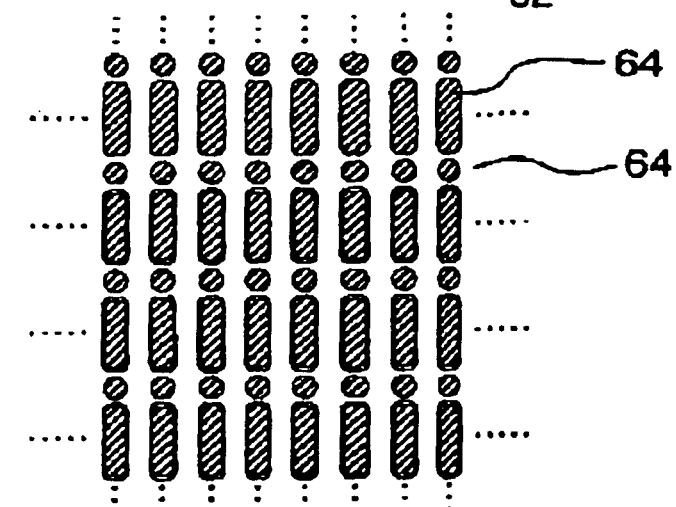

Composite ink 64 for a hole-injection layer as in the first embodiment is coated in a pattern on the display pixels 60 and the dummy pixels 61, and the composite 64 is further coated in a pattern on the middle areas between the pixels viewed in a longitudinal direction, as shown in FIG. 9B. Upon completion after drying, the hole-injection layer in the pixels exhibits a uniform thickness. If the composite 64 is not coated on the middle areas between the pixels viewed in a longitudinal direction, the thickness of the hole-injection layer would become undesirably thick at both ends of the pixels viewed in a longitudinal direction.

Figure 9C:
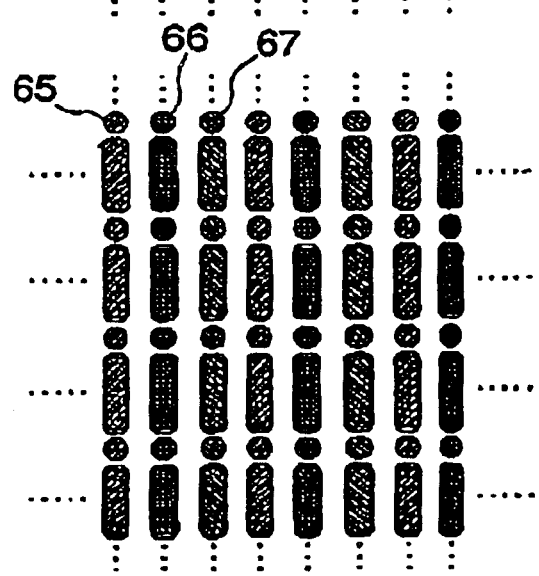

After forming the hole-injection layer, a luminous layer is formed by depositing three kinds of composites 65, 66, and 67 for the luminous layer as in the first embodiment at a pitch of 240 μm in a longitudinal direction and a pitch of 290 μm in a lateral direction. Then composite inks 65, 66, and 67 for the luminous layer are further coated in a pattern on the middle areas between the pixels viewed in a longitudinal direction, as shown in FIG. 9C, as for the hole-injection layer. After drying, the luminous layer exhibits a uniform thickness within the pixels and among a plurality of pixels. Upon completion through further steps of cathode forming and sealing, the organic EL device shows neither uneven luminance nor uneven chrominance in the area for the display pixels.

Eighth Embodiment

FIG. 10A is a plan view of the substrate used in the eighth embodiment. FIG. 10B is a partial cross-sectional view taken along plane M–M' in FIG. 10A. As shown in FIGS. 10A and 10B, the substrate 101, on which a hole-injection layer and a luminous layer have not been formed, includes a circuit element portion 103 formed on a glass substrate 102 and a luminous element portion 104 formed on the circuit element portion 103. The luminous element portion 104 includes display pixels and dummy pixels, each of which will be further explained below, and is defined by an effectively optical area A including the display pixels and a dummy area B including dummy pixels and disposed around the effectively optical area A.

The circuit element portion 103 includes a plurality of TFT elements 105 formed on the glass substrate 102 and first and second insulating membranes 106 and 107 covering the TFT elements 105. The TFT elements 105 are disposed in a matrix, to each of which a transparent electrode 108 made of ITO is connected. The transparent electrodes 108 are formed on the second insulating membrane 107 at the positions corresponding to the TFT elements 105 to be connected. The transparent electrodes 108 may be formed in the shape of a circle, a rectangle, or a rectangle having rounded corners, in a plan view.

The TFT elements 105 and the transparent electrode 108 are formed only in the area corresponding to the effectively optical area A in the luminous element portion 104.

SiO$_2$ banks 109 and polyimide banks 110 are laminated in the effectively optical area A in the luminous element portion 104. The SiO$_2$ banks 109 and the polyimide banks 110 are disposed between the transparent electrode 108 whereby apertures 111 surrounding the transparent electrode 108 are formed.

In the dummy area B, the luminous element portion 104 includes a SiO$_2$ membrane 109' formed on the second insulating membrane 107 and polyimide banks 110' formed on the SiO$_2$ membrane 109'. The polyimide banks 110' in the dummy area B define dummy pixels 111' having substantially the same shape as that of the display pixels in the effectively optical area A.

With regard to the quantity of the dummy pixels 111' formed in the dummy area B, ten or more dummy pixel sets, each of which includes three kinds of dummy pixels, i.e., a red, a green, and a blue dummy pixel, are preferably disposed in an area of width X' along the direction X shown in FIG. 10A. In an area of width Y' along the direction Y shown in FIG. 10A, ten or more of dummy pixel rows, each of which includes a number of dummy pixels, i.e., a number of red, green, and blue dummy pixels, are preferably disposed. More preferably, the dummy pixels are disposed so as to equalize width X' with width Y'. By this disposition, the drying condition for the composite ink in the pixels near the border of the dummy area B can be made substantially the same as in the pixels in the middle of the effectively optical area A. In order to make width X' equal to width Y', thirty rows of dummy pixels corresponding to rows of ten dummy pixel sets, each of which includes three kinds of dummy pixels, i.e., a red, a green, and a blue dummy pixel, may be formed parallel to the Y direction in the area of width X', and ten rows of dummy pixels may be formed parallel to the X direction in the area of width Y', provided, for example all the pixels, including both display pixels and dummy pixels, are disposed at a pitch of 70.5 μm in the X direction and at a pitch of 211.5 μm in the Y direction. In this arrangement, width X' and width Y' are substantially equalized because the pitch in the Y direction is three times that in the X direction. Although the number of the dummy pixels is not limited, as in the above example, a large number of dummy pixels 111' is not preferable because they may create too wide a peripheral region not relating to display, and consequently unnecessarily enlarge the display module.

The polyimide banks 110 and 110' are made to be ink-repelling by applying atmospheric pressure plasma treatment to the substrate 101, as in the first embodiment, and then composite ink including a hole-injection layer material is ejected in a pattern from an ink-jet head onto the display pixels 111 and the dummy pixels 111'. The composite ink of a hole-injection layer material is deposited on the transparent electrode 108 in the display pixels 111 and is deposited on the SiO$_2$ membrane 109' in the dummy pixels 111'.

A preferred process to eject the composite ink including a hole-injection layer material from an ink-jet head includes, for example: providing an ink-jet head having nozzles in an array whose length is substantially the same as the width of the luminous element portion 104 along a lateral direction (X direction in FIG. 10A); and ejecting the composite ink while moving the ink-jet head from the bottom in FIG. 10A in the direction of the arrow Y above the substrate 101. In this process, the ejection of the composite ink preferably starts in the dummy area B at the bottom of FIG. 10A, proceeds through the effectively optical area A, and ends in the dummy area B at the top of FIG. 10A, i.e., the ejection of the composite ink starts and ends in the dummy area B. The composite ink in the effectively optical area A dries uniformly because the ejection started in the dummy area B before ejection in the effectively optical area A.

Consequently, the solvent is removed under the same condition as in the first embodiment, and then a hole-injection layer 131 is formed, as shown in FIG. 11A, by heat treatment under the same conditions as in the first embodiment.

The dummy pixels 111' are provided around the effectively optical area A, to which the steps of ejecting the composite ink and drying as for the display pixels 111 are also applied. Therefore, the drying condition for the display pixels near the border of the dummy area B can be made substantially the same as for the display pixels in the middle of the effectively optical area A, whereby hole-injection layers 131 of a uniform thickness can be provided even for the display pixels near the border of the dummy area B. The hole-injection layers 131 having a uniform thickness can thus be manufactured in the entire effectively optical area A.

In the next process, as in the first embodiment, a composite ink for a red luminous layer, a composite ink for a green luminous layer, and a composite ink for a blue luminous layer are ejected from an ink-head and are deposited on both the display pixels 111 and the dummy pixels 111' in a pattern, and then luminous layers 135, 136, and 137 are formed by heat treatment at 80° C. on a hot plate in nitrogen gas for 5 minutes. The luminous layers 135, 136, and 137 having a uniform thickness can thus be formed in the effectively optical area A, like the hole-injection layers 131.

In this process of forming the luminous layers, the composite ink including luminous materials is ejected while moving the ink-jet head from the bottom in FIG. 10A in the direction of the arrow Y above the substrate 101, as in the process of forming the hole-injection layer, and the ejection of the composite ink preferably starts in the dummy area B at the bottom of FIG. 10A, proceeds through the effectively optical area A, and ends in the dummy area B at the top of FIG. 10A, i.e., the ejection of the composite ink starts and ends in the dummy area B. The composite ink including luminous materials dries uniformly over the entirety of the effectively optical area A.

After forming the luminous layers, a LiF layer 2 nm thick, a Ca layer 20 nm thick, and an Al layer 200 nm thick are respectively laminated by heated vapor deposition in a vacuum so as to form a cathode 138, and finally, a layer of epoxy resin 139 is formed to provide sealing, as shown in FIG. 11B.

An organic EL device without uneven luminance and uneven chrominance in the effectively optical area A can thus be manufactured.

Ninth Embodiment

Figure 12:
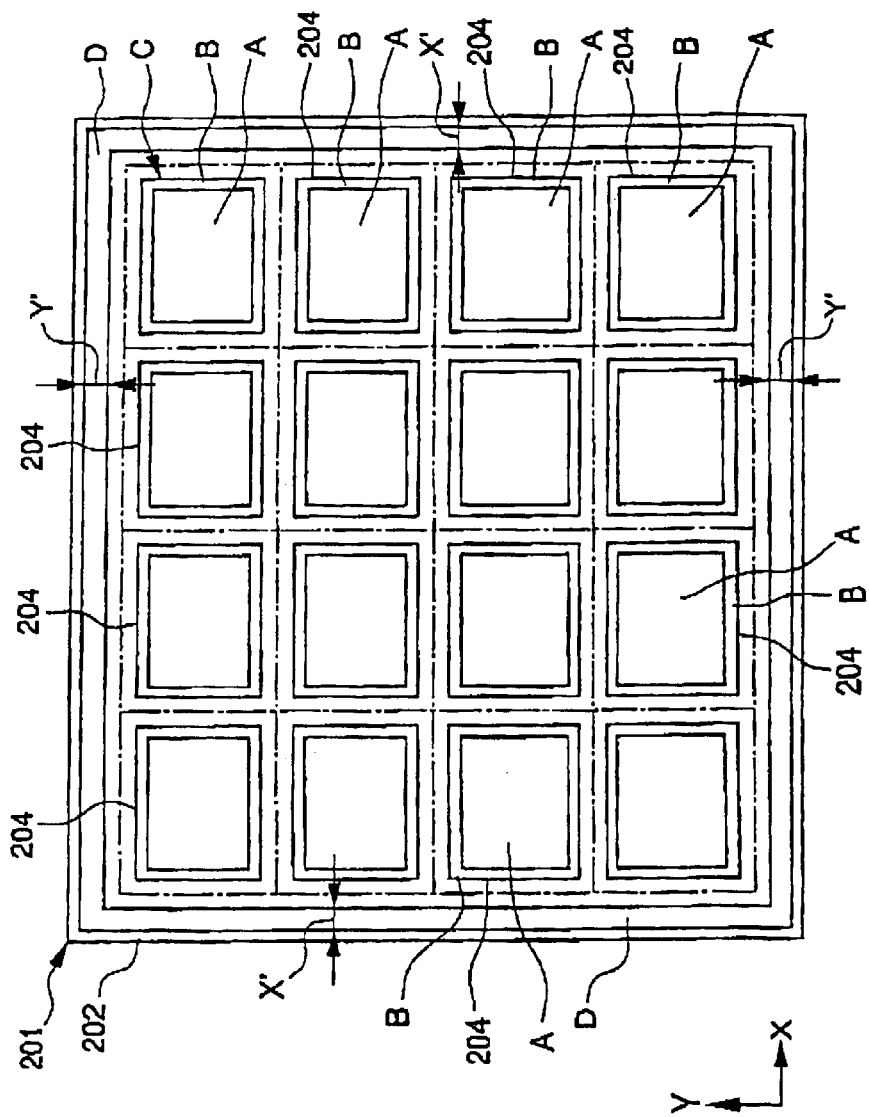
FIG. 12 is a plan view of a substrate before a hole-injection layer is formed, illustrating the ninth embodiment of the present invention for manufacturing an organic EL device.

FIG. 12 is a plan view of the substrate used in the ninth embodiment. As shown in FIG. 12, the substrate 201 mainly includes a circuit element portion (not shown) formed on a glass substrate 202, and a plurality of luminous element portions 204 formed on the circuit element portion. The substrate 201 shown in FIG. 12 includes 16 luminous element portions 204 disposed in a 4-by-4 matrix. Each of the luminous element portions 204 is provided with display pixels and dummy pixels (not shown) as in the eighth embodiment, and is defined by an effectively optical area A including the display pixels and a dummy area B including dummy pixels and disposed around the effectively optical area A.

The structure of the display pixels in the effectively optical area A and of the dummy pixels in the dummy area B are respectively the same as that of the display pixels 111 and the dummy pixels 111' described in the eighth embodiment. Similarly, the structure of the circuit element portion (not shown) is the same as that of the circuit element portion 103 in the eighth embodiment.

A group C of effectively optical areas including a plurality of effectively optical areas A is thus formed on the substrate 201.

The substrate 201 will finally be cut along the dashed lines shown in FIG. 12, and the parts will be separated from each other so as to form 16 small substrates. By using this method, a plurality of organic EL devices can be manufactured from one substrate at one time.

On the substrate 201, another dummy area D is provided around the group C of effectively optical areas.

With regard to the quantity of the dummy pixels provided in the dummy area D, ten or more dummy pixel sets, each of which includes three kinds of dummy pixels, i.e., a red, a green, and a blue dummy pixel, are preferably disposed in an area of width X' along the direction X shown in FIG. 12. In an area of width Y' along the direction Y shown in FIG. 12, ten or more dummy pixel rows, each of which consists of a number of dummy pixels, i.e., a number of red, green, and blue dummy pixels, are preferably disposed.

Polyimide banks formed on the substrate 201 is made to be ink-repelling as in the eighth embodiment. Then, composite ink including a hole-injection layer material is ejected in a pattern from an ink-jet head onto the display pixels and the dummy pixels.

A preferred process to eject the composite ink including a hole-injection layer material from an ink-jet head includes, for example: providing an ink-jet head having nozzles in an array whose length is substantially the same as the width of a single luminous element portion 204 along a lateral direction (X direction in FIG. 12); and ejecting the composite ink while moving the ink-jet head from the bottom in FIG. 12 in the direction of the arrow Y to the top. The width of the ink-jet head is not limited as in this example, and it may also be chosen so as to be a multiple of the width of a single luminous element portion 204.

Figure 13A:
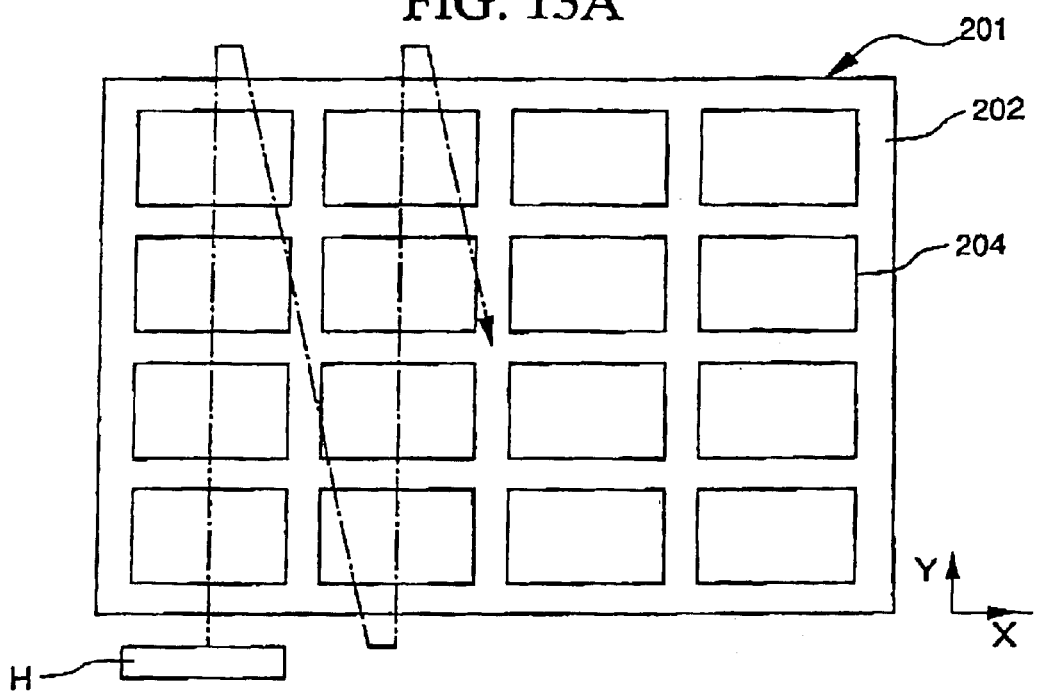
FIGS. 13A and 13B are schematic plan views showing the traced path of an ink-jet head, and illustrate the ninth embodiment of the present invention for manufacturing an organic EL device.
Figure 13B:
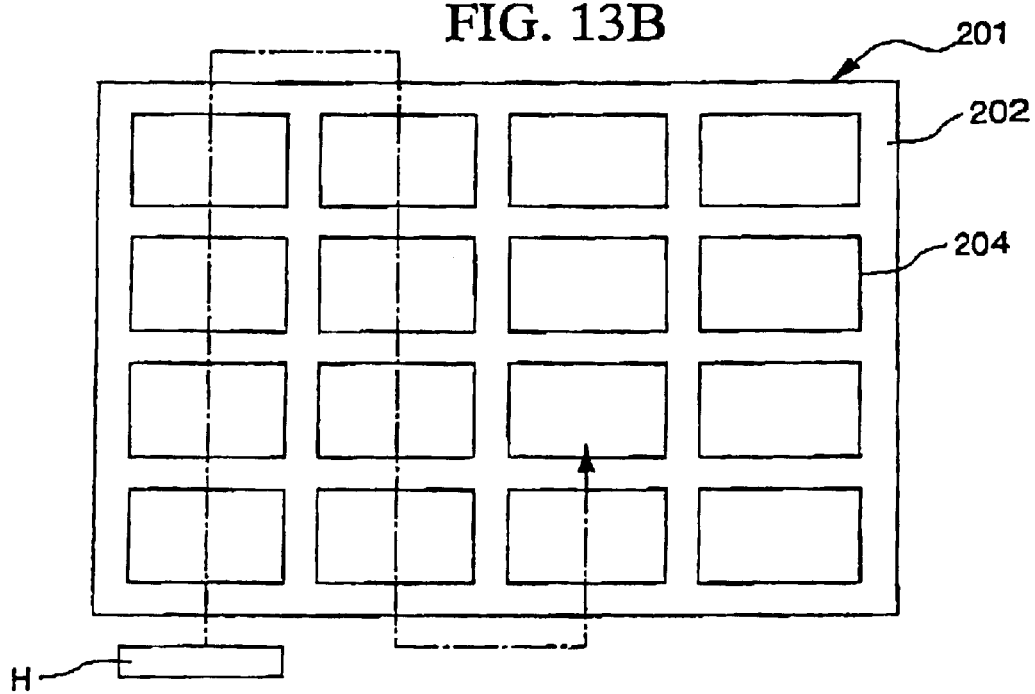

In this process, the traced path of the ink-jet head H may be as shown in FIG. 13A in which the ink-jet head H moves upwardly in view of FIG. 13A, moves diagonally and downwardly in an idling state, and moves upwardly again, or may be as shown in FIG. 13B in which the ink-jet head H moves upwardly in view of FIG. 13B, moves laterally in an idling state, and moves downwardly.

In both of the above ways, the composite ink is sequentially ejected onto the dummy areas D and B, the effectively optical area A, the dummy areas B and D, the dummy areas D and B, the effectively optical area A, ..., and the dummy areas B and D, i.e., the ejection of the composite ink starts and ends in the dummy area D.

Alternatively, the process may include, as in the eighth embodiment: providing an ink-jet head having nozzles in an array whose length is substantially the same as the width of the group C of effectively optical areas along a lateral direction (X direction in FIG. 12); and ejecting the composite ink while moving the ink-jet head from the bottom in FIG. 12 in the direction of the arrow Y to the top above the luminous element portions 204. In this case, the composite ink is sequentially ejected onto the dummy areas D and B, the effectively optical area A, the dummy areas B and D, i.e., the ejection of the composite ink starts and ends in the dummy area D.

In all of the cases described above, the composite ink in the effectively optical area A dries uniformly because the ejection started in the area D for the dummy pixels before ejection in the effectively optical area A.

In the cases shown in FIGS. 13A and 13B in which the ink jet head traces a reciprocating path, the ejection of the composite ink in the effectively optical area A is fairly stable, even if the state of the ink contained in the ink-jet head changes during an idling travel, because the ejection has started in the area D for the dummy pixels before ejecting onto the effectively optical area A, and the composite ink is always ejected onto the area D for the dummy pixels after idling of the ink-jet head.

Consequently, the solvent of the composite ink of a hole-injection layer material is removed and a hole-injection layer 131 is formed by heat treatment, under the same conditions as in the first embodiment.

The dummy pixels included in the dummy area B are provided around the effectively optical area A and these dummy pixels are further surrounded by other dummy pixels included in the dummy area D. Therefore, the drying condition for the display pixels near the border of the dummy area B can be made substantially the same as for the display pixels in the middle of the effectively optical area A, whereby hole-injection layers of a uniform thickness can be provided in the entirety of the effectively optical area A even for the display pixels near the border of the dummy area B.

The hole-injection layers having a uniform thickness can thus be manufactured, even in a case in which a number of display devices are manufactured from a single substrate because the dummy area D is provided around the group C of the effectively optical areas.

In the next process, as in the first embodiment, a composite ink for a red luminous layer, a composite ink for a green luminous layer, and a composite ink for a blue luminous layer are ejected from an ink-jet head and are deposited in both the effectively optical area and the dummy area in a pattern, and then the red, green, and blue luminous layers are formed by heat treatment. The luminous layers having a uniform thickness can thus be formed in the effectively optical area A, like the hole-injection layers.

In this process of forming the luminous layers, the composite ink is preferably ejected while moving the ink-jet head as shown in FIG. 13A or 13B, as in the process of forming the hole-injection layer, and the ejection of the composite ink preferably starts and ends in the dummy area D, whereby the composite ink dries uniformly over the entirety of the effectively optical area A.

After forming the luminous layers, a LiF layer 2 nm thick, a Ca layer 20 nm thick, and an Al layer 200 nm thick are respectively laminated by heated vapor deposition in a vacuum so as to form a cathode, and finally, a layer of epoxy resin is formed to provide sealing.

An organic EL device without uneven luminance and uneven chrominance in the effectively optical area A can thus be manufactured.

Figure 14:
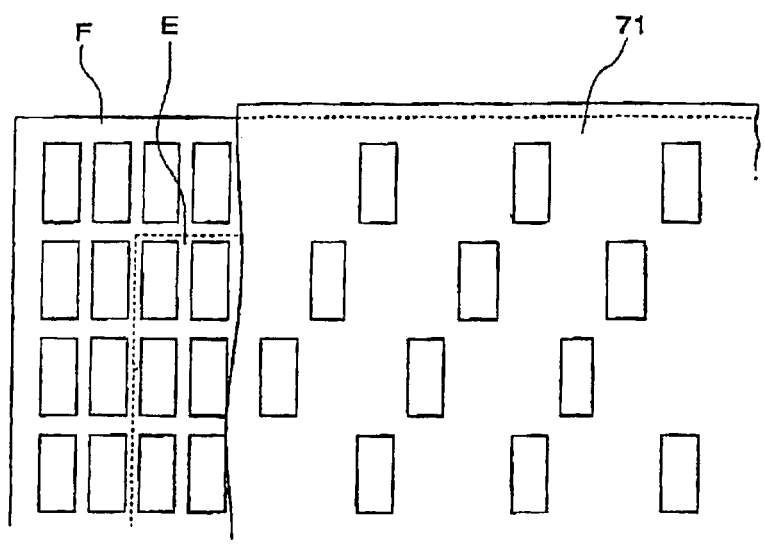
FIG. 14 is a plan view showing another method for manufacturing an organic EL device similar to that in the ninth embodiment.

Although a high molecular material is used for the organic EL layer in the foregoing embodiments, a low molecular material may be used instead. The organic EL layer is preferably formed by a vapor deposition method using a mask 71, as shown in FIG. 14, when a low molecular material is used therefor. An organic EL device according to the present invention can be manufactured by using a mask having a set of apertures corresponding to an effectively optical area E and another set of apertures corresponding to an area other than the effectively optical area E, i.e., a dummy area F. Uniform organic EL layers can be formed in the entirety of the effectively optical area by also providing the dummy area in the vapor deposition method.

Tenth Embodiment

Examples of electronic devices including an organic EL device manufactured by using a method according to any one of the first to ninth embodiments described above will be explained below.

Figure 15A:
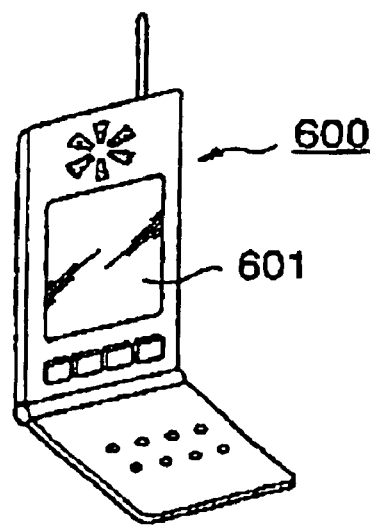
FIGS. 15A to 15C are perspective views of electronic devices according to the tenth embodiment of the present invention.

FIG. 15A is a perspective view of an example of a portable telephone. In FIG. 15A, reference numeral 600 indicates a body of the portable telephone, and reference numeral 601 indicates a display portion including any one of the organic EL devices described above.

Figure 15B:
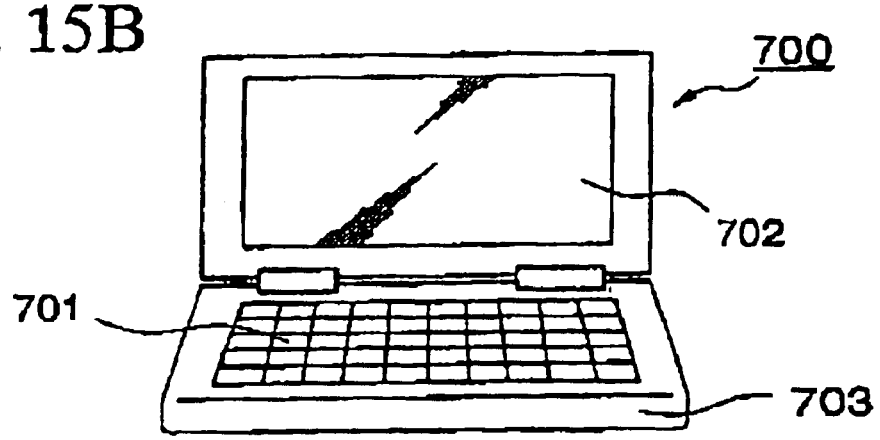

FIG. 15B is a perspective view of an example of a portable information processor, such as a word processor and a personal computer. In FIG. 15B, reference numeral 700 indicates an information processor, reference numeral 701 indicates an input device, such as a keyboard, reference numeral 703 indicates a body of the information processor, and reference numeral 702 indicates a display portion including any one of the organic EL devices described above.

Figure 15C:
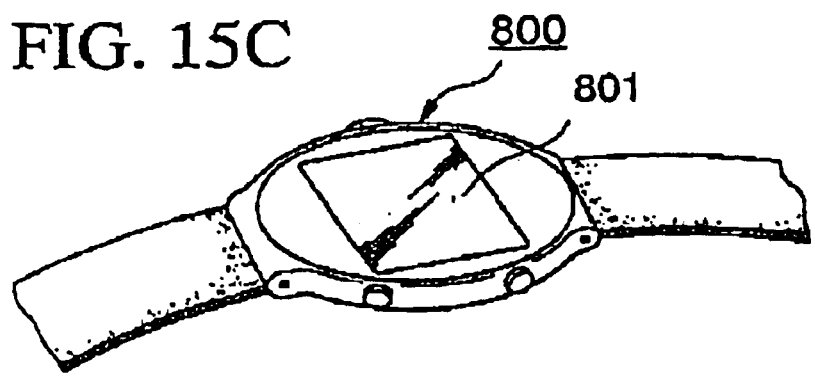

FIG. 15C is a perspective view of an example of a watch. In FIG. 15C, reference numeral 800 indicates a body of the watch, and reference numeral 801 indicates a display portion including any one of the organic EL devices described above.

Each of the electronic devices shown in FIGS. 15A to 15C includes a display portion including any one of the organic EL devices described above, and consequently has the same advantages as that of the organic EL device manufactured using a method according to any one of the first to ninth embodiments described above. Therefore, these electronic devices will exhibit excellent display performance.

As described above, in a method for manufacturing an organic EL device using an ink-jet method to eject and coating an organic EL material on a substrate to form an organic EL layer, a dummy coating area is provided around an area for display pixels, and ink droplets are disposed at a constant pitch in the area for display pixels, according to the present invention. The organic EL material solution coated on the effectively optical area dries uniformly and a uniform display device without uneven luminance and uneven chrominance within a pixel or among a plurality of pixels in the effectively optical area can be obtained.

What is claimed is:

1. A method for manufacturing an organic EL device, comprising:

coating a composition including an organic EL material above a plurality of electrodes to form an organic EL layer above each of the plurality of electrodes;

defining an effectively optical area in which the plurality of electrodes are formed; and defining a coating area, that is broader than the effectively optical area, in which the composition including the organic EL material is to be coated.

2. The method according to claim 1, the defining a coating area step including defining the coating area to include the perimeter of the effectively optical area.

3. The method according to claim 1, the defining a coating area step including defining the coating area located along the perimeter of the effectively optical area to be a dummy area in which the composition including the organic EL material is also coated to form an organic EL layer.

4. The method according to claim 3, further comprising:

forming a layer made of the same material as that of the electrodes in the dummy area; and coating the composition including the organic EL material on the layer.

5. The method according to claim 1, further comprising:

providing a group of effectively optical areas formed of a plurality of the effectively optical areas on a substrate; and defining dummy areas around the effectively optical areas, respectively, and another dummy area encompassing the group of effectively optical areas.

6. The method according to claim 3, further including starting the step of coating the composition including the organic EL material at the dummy area prior to coating on the effectively optical area and ending at the dummy area after coating on the effectively optical area.

7. The method according to claim 1, further including disposing individual areas to be coated in the entirety of the coating area at a constant pitch from each other.

8. The method according to claim 7, further including disposing any one of the electrodes relative to adjacent ones of the electrodes at a constant pitch.

9. A method for manufacturing an organic EL device which includes an effectively optical area having a plurality of electrodes and an organic EL layer formed above each of the plurality of electrodes, the method comprising:

forming the organic EL layer both on areas that are to be the effectively optical area and on other areas that are not to be the effectively optical area.

10. A method for manufacturing an organic EL device which includes an effectively optical area having a plurality of electrodes and an organic EL layer formed above each of the plurality of electrodes, the method comprising:

forming the organic EL layer in areas not having the electrodes and which are supposed to be the effectively optical area.

11. An organic EL device manufactured according to the method of claim 1.

* * * * *